(12) United States Patent
Tanaka et al.

(10) Patent No.: US 7,551,655 B2
(45) Date of Patent: Jun. 23, 2009

(54) LASER IRRADIATION APPARATUS, LASER IRRADIATION METHOD AND METHOD FOR MANUFACTURING SEMICONDUCTOR DEVICE

(75) Inventors: Koichiro Tanaka, Atsugi (JP); Yoshiaki Yamamoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 410 days.

(21) Appl. No.: 10/997,868

(22) Filed: Nov. 29, 2004

(65) Prior Publication Data
US 2005/0115930 A1 Jun. 2, 2005

(30) Foreign Application Priority Data
Dec. 2, 2003 (JP) .............................. 2003-403155

(51) Int. Cl.
*H01S 3/10* (2006.01)
(52) U.S. Cl. .......................................... 372/25; 372/28
(58) Field of Classification Search .................. 372/25, 372/28
See application file for complete search history.

(56) References Cited

U.S. PATENT DOCUMENTS

| 4,845,354 | A | | 7/1989 | Gupta et al. |
| 5,272,708 | A | | 12/1993 | Esterowitz et al. |
| 5,450,230 | A | | 9/1995 | Masuda et al. |
| 5,654,998 | A | * | 8/1997 | Turcu et al. ............. 378/119 |
| 5,936,726 | A | * | 8/1999 | Takeda et al. ........... 356/237.2 |
| 6,037,967 | A | | 3/2000 | Allen et al. |
| 6,242,292 | B1 | | 6/2001 | Yamazaki et al. |
| 6,368,945 | B1 | | 4/2002 | Im |
| 6,407,431 | B2 | | 6/2002 | Yamazaki et al. |
| 6,483,858 | B1 | | 11/2002 | Hovater et al. |
| 6,549,547 | B2 | | 4/2003 | Galvanauskas et al. |

(Continued)

FOREIGN PATENT DOCUMENTS

EP  1537938  6/2005

(Continued)

OTHER PUBLICATIONS

Choi et al., "Ultrafast Laser-Induced Crystallization of Amorphous Silicon Films," Optical Engineering, vol. 42, No. 11, Nov. 1, 2003, pp. 3383-3388.

(Continued)

*Primary Examiner*—Dung T Nguyen
(74) *Attorney, Agent, or Firm*—Eric J. Robinson; Robinson Intellectual Property Law Office, P.C.

(57) ABSTRACT

The object of the present invention is to provide a laser irradiation apparatus being able to enlarge the beam spot to a large degree compared with that of the CW laser, to suppress the thermal damage to the glass substrate, and to form an aggregation of crystal grains including a single crystal extending long in a scanning direction by growing the crystal continuously in the scanning direction. The laser irradiation of the present invention comprises a pulsed laser oscillator, a non-linear optical element for converting the wavelength of the laser light emitted from the pulsed laser oscillator, and an optical system for condensing the laser light whose wavelength is converted on a semiconductor film, wherein the pulsed laser oscillator has a repetition rate in the range of 10 MHz to 100 GHz.

84 Claims, 8 Drawing Sheets

U.S. PATENT DOCUMENTS

| | | | |
|---|---|---|---|
| 6,574,250 | B2 | 6/2003 | Sun et al. |
| 6,618,423 | B1 | 9/2003 | Dekorsy et al. |
| 6,760,356 | B2 | 7/2004 | Erbert et al. |
| 6,764,886 | B2 | 7/2004 | Yamazaki et al. |
| 6,778,565 | B2 | 8/2004 | Spuehler et al. |
| 6,908,797 | B2 | 6/2005 | Takano |
| 6,958,853 | B1 * | 10/2005 | Arnone et al. ............ 359/326 |
| 7,112,760 | B2 | 9/2006 | Ishikawa et al. |
| 7,279,372 | B2 | 10/2007 | Yamazaki et al. |
| 2001/0019859 | A1 | 9/2001 | Yamazaki et al. |
| 2002/0094008 | A1 | 7/2002 | Tanaka |
| 2003/0031214 | A1 | 2/2003 | Tanaka et al. |
| 2003/0058904 | A1 | 3/2003 | Krainer et al. |
| 2003/0102290 | A1 * | 6/2003 | Shaffer ............... 219/121.69 |
| 2003/0235971 | A1 | 12/2003 | Yamazaki et al. |
| 2004/0053480 | A1 | 3/2004 | Tanabe et al. |
| 2004/0058501 | A1 | 3/2004 | Maiz et al. |
| 2004/0069751 | A1 * | 4/2004 | Yamazaki et al. ....... 219/121.6 |
| 2004/0074881 | A1 * | 4/2004 | Oishi .................. 219/121.63 |
| 2004/0209410 | A1 | 10/2004 | Tanaka |
| 2005/0036190 | A1 | 2/2005 | Tanaka |
| 2005/0037552 | A1 | 2/2005 | Yamazaki et al. |
| 2005/0115930 | A1 | 6/2005 | Tanaka et al. |
| 2005/0139582 | A1 | 6/2005 | Tanaka |
| 2005/0139786 | A1 | 6/2005 | Tanaka et al. |
| 2006/0079041 | A1 | 4/2006 | Yamazaki et al. |

FOREIGN PATENT DOCUMENTS

| | | |
|---|---|---|
| JP | 62-259437 | 11/1987 |
| JP | 06-201333 | 7/1994 |
| JP | 06-320292 | 11/1994 |
| JP | 10-153746 | 6/1998 |
| JP | 2003-086507 | 3/2003 |
| WO | WO 98/27450 | 6/1998 |
| WO | WO 2003/028177 | 4/2003 |

OTHER PUBLICATIONS

Office Action (U.S. Appl. No. 11/017,900) Dated Jan. 9, 2008.
Office Action (U.S. Appl. No. 11/017,899) Dated Nov. 13, 2007.
Office Action (Chinese Application No. 200410100134.7) Dated Apr. 25, 2008.
Office Action (U.S. Appl. No. 11/017,899), dated Jul. 7, 2008.
Search Report (Application No. 04027765.9) dated Jan. 16, 2009.
Ohyama, H. et al., "Free Electron Laser Annealing of Silicon Carbide," Database Inspec [Online], The Institution of Electrical Engineers, Stevenage, GB, Mar. 1997, XP002505532, Database Accession No. 5581060, 1 page Abstract.
Search Report (Application No.04029713.7) Dated Dec. 19, 2008.

* cited by examiner

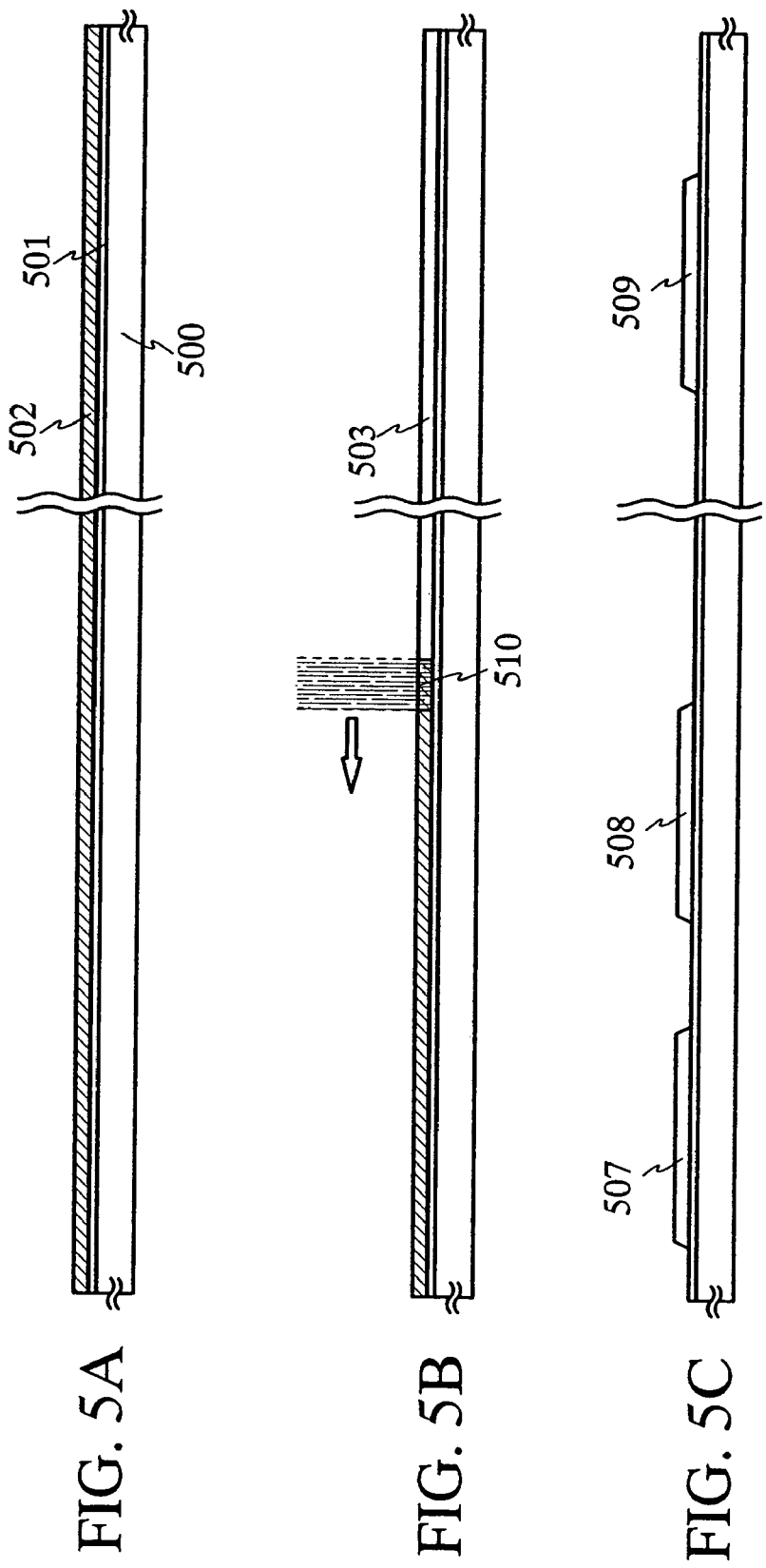

LASER IRRADIATION APPARATUS, LASER IRRADIATION METHOD AND METHOD FOR MANUFACTURING SEMICONDUCTOR DEVICE

BACKGROUND OF THE INVENTION

1. Field of the Invention

The present invention relates to a laser irradiation apparatus used to crystallize a semiconductor film. Moreover, the present invention relates to a laser irradiation method and a method for manufacturing a semiconductor device that use the laser irradiation apparatus.

2. Related Art

A thin film transistor formed using a poly-crystalline semiconductor film (this thin film transistor is hereinafter referred to as a poly-crystalline TFT) is superior in mobility by two digits or more compared to a TFT formed using an amorphous semiconductor film. Therefore, the poly-crystalline TFT has an advantage that a pixel portion and its peripheral driver circuit of a semiconductor display device can be integrally formed over a same substrate. The poly-crystalline semiconductor film can be formed over an inexpensive glass substrate by using a laser annealing method.

In the lasers, there are a pulsed laser and a continuous wave (CW) laser according to the oscillation method. The output power per unit time of the pulsed laser typified by an excimer laser is approximately three to six digits higher than that of the CW laser. Therefore, the laser irradiation can be performed efficiently to the semiconductor film by shaping a beam spot (the region on the surface of the processing object where the laser light is irradiated in fact) of pulsed laser light into a rectangle having a length of several cm in a side or a line having a length of 100 mm or more through an optical system. That is to say, the pulsed laser has an advantage of high throughput. For this reason, the pulsed laser has been mainly used to crystallize the semiconductor film.

It is noted that the term of linear herein used does not mean a line in a strict sense but means a rectangle having a large aspect ratio (or an oblong). For example, the rectangular having an aspect ratio of 2 or more (preferable in the range of 10 to 10000) is referred to as the linear. It is noted that the linear is still included in the rectangular.

The semiconductor film crystallized thus by the pulsed laser has an aggregation of crystal grains each having a random position and a random size. Compared to the inside of the crystal grain, a boundary between the crystal grains (a crystal grain boundary) has an amorphous structure and an infinite number of recombination centers and trapping centers existing due to crystal defects. When a carrier is trapped in the trapping center, potential of the crystal grain boundary increases to become a barrier against the carrier, and therefore a transporting characteristic of the carrier is lowered.

In view of the above problem, recently, attention has been paid to a technique of crystallizing the semiconductor film using a CW laser. Unlike the conventional pulsed laser, the CW laser makes it possible to grow crystal continuously toward the scanning direction and to form an aggregation of crystal grains including a single crystal extending long in the scanning direction by irradiating the semiconductor film with the CW laser light while scanning the CW laser light in one direction. With this technique, it is considered that a semiconductor film having almost no crystal grain boundary at least that intersects the channel direction of the TFT can be formed.

The laser light having higher absorption coefficient to the semiconductor film can crystallize the semiconductor film more efficiently. In the case of crystallizing a silicon film having a thickness from several tens to several hundred nm, which is generally used in a semiconductor device, with the use of a YAG laser or a $YVO_4$ laser, a second harmonic having a shorter wavelength than a fundamental wave is usually used because the second harmonic has much higher absorption coefficient than the fundamental wave. The fundamental wave is hardly used in the crystallization step. The harmonic can be obtained by converting the fundamental wave using a non-linear optical element.

However, the CW laser has a problem that the resistance of the non-linear optical element against the laser light is much lower than that when using the pulsed laser because the CW laser burdens the non-linear optical element continuously. Moreover, since the CW laser has lower output power than the pulsed laser per unit time, the density of photon to time is also low, and therefore the conversion efficiency into the harmonic using the non-linear optical element is low. Specifically, although the conversion efficiency depends on the mode characteristic or the time characteristic of the incident light, the CW laser generally has the conversion efficiency from approximately 0.2 to 0.3% while the pulsed laser has the conversion efficiency from approximately 10 to 30%.

Therefore, since the harmonic of the CW laser has lower power than that of the pulsed laser per unit time, it is difficult to increase the throughput by enlarging the beam spot of the CW laser. For example, the fundamental wave of the CW YAG laser can have a power of 10 kW while the second harmonic thereof can have a power as low as approximately 10 W. In this case, in order to obtain the energy density that is required to crystallize the semiconductor film, it is necessary to make the square measure of the beam spot as small as approximately $10^{-3}$ mm$^2$. As thus described, the CW laser is inferior to the pulsed excimer laser in terms of throughput, and this causes low productivity.

It is noted that opposite ends of the beam spot in the direction perpendicular to the scanning direction form a region in which the crystal grain is extremely small and the crystallinity is inferior compared to the center of the beam spot. Even though a semiconductor element is formed in such a region, high characteristic cannot be expected. Moreover, although the adjustment of the optical system can decrease to some extent the region in which the extremely small crystal grain is formed, this region cannot be eliminated completely. Therefore, it is important to enlarge the width of the beam spot in the direction perpendicular to the scanning direction in order to relax the restriction on the layout of the semiconductor element. However, in the case of the CW laser, it is difficult to enlarge the beam spot according to the above reason, and the width of the beam spot of the CW laser is narrower than that of the pulsed laser. Therefore, the layout of the semiconductor element is restricted.

Although the CW laser can form the nonequilibrium state thermodynamically, the CW laser has an output power as low as approximately several kW in contrast with the pulsed laser having a peak power as high as several MW or more. Therefore, even in the nonequilibrium state, the CW laser is not preferable because the CW laser gives more thermal damage to the glass substrate than the pulsed laser when performing the laser annealing to the semiconductor film over the glass substrate. When the thermal damage is given too much to the glass substrate, the glass substrate shrinks accordingly.

SUMMARY OF THE INVENTION

In view of the above problem, it is an object of the present invention to provide a laser irradiation apparatus that can make the beam spot much larger than a CW laser irradiation apparatus, that can suppress the thermal damage given to the glass substrate, and that can grow the crystal continuously toward the scanning direction so as to form an aggregation of the crystal grains including a single crystal extending long in the scanning direction. Moreover, it is an object of the present invention to provide a laser irradiation apparatus that can suppress the deterioration of the non-linear optical element and that can obtain the laser light having higher power. Furthermore, it is an object of the present invention to provide a laser irradiation method and a method for manufacturing a semiconductor device that use the laser irradiation apparatus.

The present inventors considered that it is possible to obtain the crystal grain growing continuously toward the scanning direction by oscillating the laser light at the pulse repetition rate that is determined so that the pulsed laser light is irradiated after the semiconductor film is melted by the previous pulsed laser light and before it is solidified. That is to say, the lower limit of the pulse repetition rate is determined so that the pulse period becomes shorter than the period since the semiconductor film is melted until it is solidified.

In the present invention, the pulsed laser has a repetition rate of 10 MHz or more. This repetition rate is extremely higher than that of the pulsed laser used usually, which is from several tens to several hundred Hz. It is said that it takes several tens to several hundred ns to solidify the semiconductor film completely after the semiconductor film is irradiated with the pulsed laser light. When the pulsed laser light has a repetition rate of 10 MHz or more, it is possible to irradiate the pulsed laser light after the semiconductor film is melted by the previous laser light and before the semiconductor film is solidified. Therefore, unlike the case using the conventional pulsed laser, the interface between the solid phase and the liquid phase can be moved continuously in the semiconductor film, and the semiconductor film having a crystal grain grown continuously toward the scanning direction is formed. Specifically, it is possible to form an aggregation of crystal grains each of which has a width from 10 to 30 μm in the scanning direction and a width from approximately 1 to 5 μm in a direction perpendicular to the scanning direction. It is also possible to form a semiconductor film having almost no crystal grain boundary at least in the channel direction of the TFT by forming a crystal grain of a single crystal extending long in the scanning direction.

When the conventional pulsed laser is used to crystallize the semiconductor film, the impurity such as oxygen, nitrogen, or carbon is likely to segregate in the crystal grain boundary. Particularly when the crystallization using the laser light is combined with the crystallization using the catalyst metal, the catalyst metal that is not gettered may segregate. However, in the present invention, since the interface between the solid phase and the liquid phase can be moved continuously, it is possible to prevent the impurity having positive segregation coefficient from segregating, to purify the semiconductor film, and to homogenize the density of the solute like a zone melting method. Therefore, the characteristic of the semiconductor element formed using the semiconductor film can be enhanced, and the variation of the characteristic can be suppressed between the semiconductor elements.

In the case of the CW laser, the time for which any one point in the semiconductor film is irradiated with the laser light is an order of 10 μs. In the present invention, since the pulse repetition rate is as high as 10 MHz or more, the pulse width is 1 ns or less. Therefore, the time for which the one point is irradiated with the laser light can be $10^4$ times shorter than that of the CW laser, and the peak power can be made considerably higher than that of the CW laser. For this reason, when a semiconductor film formed over a substrate is crystallized, the present invention can suppress the amount of heat given to the substrate to a large degree compared to the CW laser. Therefore, it is possible to prevent the substrate from shrinking and to prevent the impurity from diffusing to the semiconductor film from another film. As a result, the characteristic of the semiconductor element can be enhanced and the yield can be boosted.

Moreover, since the pulse repetition rate is considerably higher than before, the pulse width is shortened to be an order of picosecond in accordance with the pulse repetition rate. Accordingly, an additional advantage can be also obtained in which the interference caused by the light reflected from the rear surface of the substrate can be suppressed even when the laser light is irradiated vertically to the substrate. The interference can be suppressed because the time for which the light returned to the semiconductor film after reflecting on the rear surface of the substrate having a thickness of approximately 1 mm exists simultaneously with the light newly incident into the semiconductor film can be made considerably short when the pulse width is an order of picosecond. The pulsed laser generally used has a pulse width from 10 to several hundred ns for which the light travels approximately 3 to 100 m. On the other hand, the pulsed laser of the present invention has a pulse width that is an order of picosecond. For example, when the pulse width is 10 ps, the light travels approximately 3 mm, which is extremely short compared with the case using the conventional pulsed laser. Therefore, the time for which the light returned to the semiconductor film after reflecting on the rear surface of the substrate having a thickness of approximately 1 mm exists simultaneously with the light newly incident into the semiconductor film is short, and the interference can be suppressed. As a result, it is not necessary to irradiate the laser light obliquely to the semiconductor film in consideration of the interference, and the laser light can be irradiated to the substrate vertically. This makes the optical design easy and can make the energy distribution of the obtained beam spot more homogenous. Moreover, when the laser light is irradiated obliquely, it is difficult to perform the homogeneous laser annealing because the condition of the laser irradiation is different according to the scanning direction of the processing object. In order to perform homogeneous annealing when the laser light is irradiated obliquely, it is necessary to perform the laser annealing in one direction though the throughput is decreased. However, in the present invention, since the laser light can be irradiated vertically, the condition of the laser irradiation is always the same regardless of the scanning direction. Therefore, even when the processing object is scanned back and forth, the homogeneity of the laser annealing is not affected, and the throughput can be raised.

In order for the laser light not to cause the interference at all, the pulse width t of the laser light may be determined so as to satisfy an inequality 1 shown below where c is the speed of light in vacuum, n is the refractive index of the substrate, and d is the thickness of the substrate.

$$ct < 2nd \quad (1)$$

For example, when a glass substrate has a thickness of 0.7 mm and a refractive index of 1.5 and when the speed of light in vacuum is 300,000 km/s, the pulse width t may be less than 7 ps in order for the laser light not to cause the interference at all.

In the case where the poly-crystalline semiconductor film is formed by the laser annealing method, when the power of the laser light fluctuates widely, the crystallization is not performed homogeneously. In such a case, when TFTs are manufactured using the poly-crystalline semiconductor film as the active layer, the characteristic such as the on current or the mobility varies between these TFTs. Since the laser light fluctuates temporally for ±1% even though the laser light does not interfere, it is considered that the spatial light and shade of the luminance due to the interference can be prevented from being visible in the pixel portion by suppressing the interference to such a degree that the spatial fluctuation of the power becomes less than ±1% when forming the TFT used for the pixel portion of the semiconductor display device.

On the other hand, in the case of irradiating an amorphous semiconductor film formed over a glass substrate with laser light having a second harmonic, it is considered that a half of the laser light is reflected on a surface of the amorphous semiconductor film and that the other half thereof goes into the amorphous semiconductor film. Since the semiconductor film used as an active layer of the TFT in the semiconductor display device has a thickness of approximately several tens nm, it is considered from the absorption coefficient of the amorphous semiconductor film that a half of the laser light among the laser light going into the amorphous semiconductor film is absorbed in the amorphous semiconductor film and that the other half thereof goes into the glass substrate. Then, approximately 4% of the laser light going into the glass substrate is reflected on the rear surface of the glass substrate and goes into the amorphous semiconductor film again. Therefore, the ratio of the light returned to the amorphous semiconductor film after reflecting on the rear surface of the glass substrate with respect to the light incident into the amorphous semiconductor film from the laser oscillator is approximately 2%. When these light interfere, the power fluctuates for ±2%.

Therefore, in order to suppress the interference to such a degree that the spatial fluctuation of the power is less than ±1%, the time for which the light interferes may be made shorter than a half of the pulse width t. It is more preferable that the time for which the any one region in the amorphous semiconductor film is irradiated simultaneously with the two laser light is 10% or less of the pulse width. In the case of making the time for which the laser light interferes shorter than a half of the pulse width t, it is understood from the inequality 1 that the pulse width t of the laser light may satisfy an inequality 2 shown below.

$$ct<4nd \quad (2)$$

Specifically, the present invention provides a laser irradiation apparatus including a pulsed laser oscillator, a non-linear optical element for converting a wavelength of laser light emitted from the pulsed laser oscillator, and an optical system for condensing the laser light whose wavelength is converted on a processing object, wherein the pulsed laser oscillator has a pulse repetition rate of 10 MHz or more. The laser irradiation apparatus having the above structure can suppress the deterioration of the non-linear optical element compared with the case using the CW laser, increase the power of the laser light whose wavelength is converted, and enlarge the beam spot formed on the processing object. When a semiconductor film is irradiated with the laser light using the laser irradiation apparatus of the present invention, the present invention can provide a semiconductor film having a crystal grain grown continuously to the scanning direction, which cannot be obtained by the conventional pulsed laser.

The present invention provides a laser irradiation method including the steps of converting a wavelength of laser light emitted from a pulsed laser oscillator using a non-linear optical element and irradiating a processing object with the laser light whose wavelength is converted, wherein the pulsed laser oscillator has a pulse repetition rate of 10 MHz or more. The laser irradiation method having the above structure can suppress the deterioration of the non-linear optical element compared with the case using the CW laser, increase density of the photon to time because the peak power increases, and increase the conversion efficiency into the harmonic of the non-linear optical element. Therefore, it is possible to increase the power of the laser light whose wavelength is converted, to enlarge the beam spot formed on the processing object, and therefore to increase the throughput. When a semiconductor film is irradiated with the laser light using the laser irradiation method of the present invention, the present invention can provide a semiconductor film having a crystal grain grown continuously to the scanning direction, which cannot be obtained by the conventional pulsed laser.

The present invention provides a method for manufacturing a semiconductor device including the steps of converting a wavelength of laser light emitted from a pulsed laser oscillator using a non-linear optical element and irradiating a processing object with the laser light whose wavelength is converted, wherein the pulsed laser oscillator has a pulse repetition rate of 10 MHz or more. The method for manufacturing a semiconductor device having the above structure can suppress the deterioration of the non-linear optical element compared with the case using the CW laser, increase density of the photon to time because the peak power increases, and increase the conversion efficiency into the harmonic of the non-linear optical element. Therefore, it is possible to increase the power of the laser light whose wavelength is converted and to enlarge the beam spot formed on the processing object. This makes it possible to increase the throughput and to relax the restriction of the layout of the semiconductor element. When a semiconductor element is manufactured using the method for manufacturing a semiconductor device of the present invention, it is possible to obtain a semiconductor element including a semiconductor film that has a crystal grain grown continuously to the scanning direction, which cannot be obtained by the conventional pulsed laser, and to enhance the characteristic of the semiconductor element.

When the beam spot is shaped into linear, it is possible to decrease the proportion of the region formed in opposite ends of the linear beam spot in a direction of its long side where the crystallinity is inferior in the whole beam spot. However, the shape of the beam spot in the present invention is not limited to linear, and it may be rectangular or square when the sufficient annealing can be performed to the irradiated object.

The present invention can be applied to a pulsed laser that can oscillate at a repetition rate of 10 MHz or more. It is possible to use an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a ceramic laser, a glass laser, a ruby laser, an alexandrite laser, a Ti: Sapphire laser, a copper vapor laser, or a gold vapor laser when it can achieve the pulse repetition rate of 10 MHz or more.

In the step of crystallizing the semiconductor film using the laser, the throughput can be raised when the semiconductor film is crystallized in such a way that the beam spot is shaped into a long ellipse or a rectangle and that the beam spot is scanned in a direction of its short axis. The laser light is shaped into ellipse because the original shape of the laser light is circular or near circular. The laser light whose original shape is rectangular may be also used after transforming the laser light by expanding it in one direction through a cylindrical lens or the like so that its long side becomes longer. Moreover, a plurality of laser light each of which is shaped into long ellipse or rectangle may be chained in one direction to form a longer beam in order to raise the throughput further.

It is noted that the method for manufacturing a semiconductor device of the present invention can be applied to manufacture an integrated circuit and a semiconductor display device. As the semiconductor display device, there are a liquid crystal display device, a light-emitting device with a light-emitting element typified by an organic light-emitting element equipped in each pixel, a DMD (Digital Micromirror Device), a PDP (Plasma Display Panel), an FED (Field Emission Display), and the like.

In the present invention, the beam spot can be enlarged remarkably compared with the beam spot of the CW laser. Therefore, it is possible to decrease the proportion of the region where the crystallinity is inferior in the beam spot and to increase the throughput. Moreover, the thermal damage to the glass substrate can be suppressed compared with the CW laser. Furthermore, in the present invention, since the resistance of the non-linear optical element against the laser can be raised compared with the case using the CW laser, the maintenance of the non-linear optical element can be facilitated. Particularly when using a solid laser, the present invention can take an advantage of the solid laser that the maintenance-free state can be kept long. In the present invention, unlike the conventional pulsed laser, the crystal can be grown continuously to the scanning direction, and an aggregation of the crystal grains including a single crystal extending long toward the scanning direction can be formed.

BRIEF DESCRIPTION OF THE DRAWINGS

In the accompanying drawings:

FIGS. 5A to 5C are drawings for showing a laser irradiation method and a method for manufacturing a semiconductor device of the present invention;

DETAILED DESCRIPTION OF THE INVENTION

EMBODIMENT MODE

Figure 1:
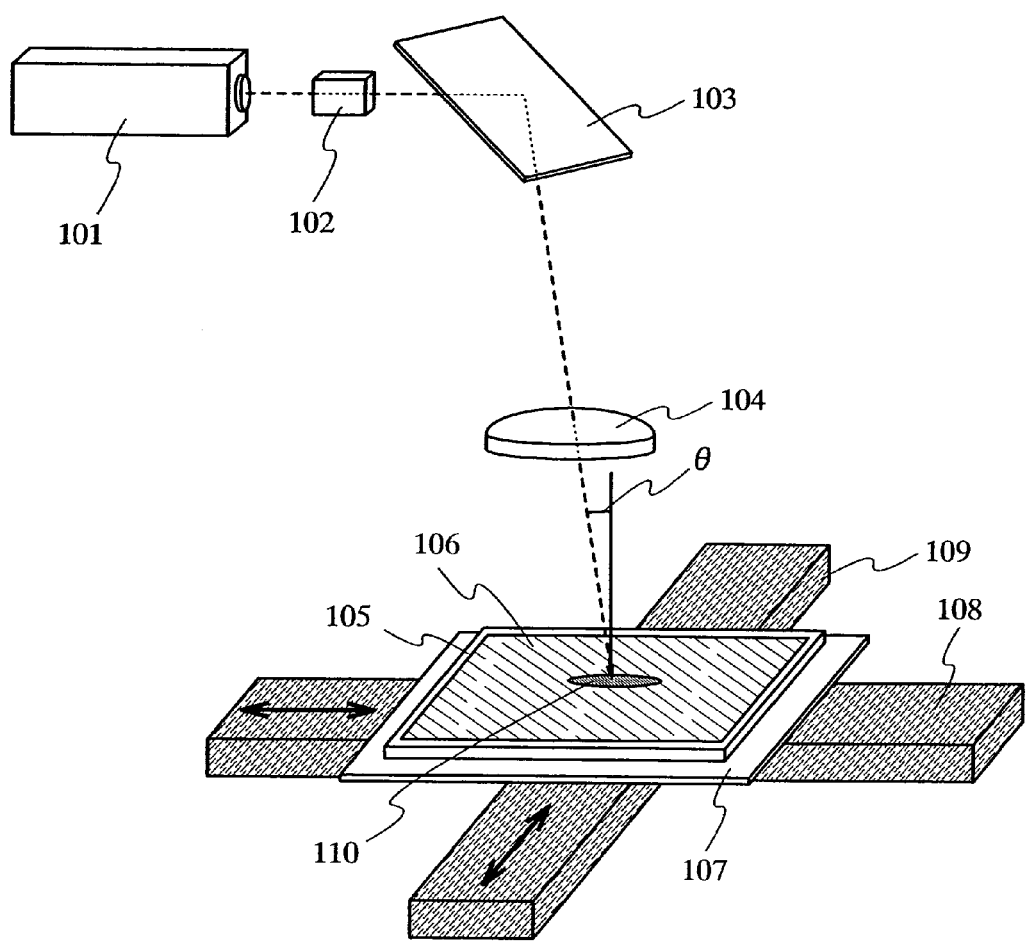
FIG. 1 is a drawing for showing a laser irradiation apparatus of the present invention.

This embodiment mode explains a structure of the laser irradiation apparatus of the present invention with reference to FIG. 1.

A reference numeral 101 denotes a pulsed $YVO_4$ laser having an output power of 1.8 W. A reference numeral 102 denotes a non-linear optical element. The laser oscillator 101 has a stable resonator and preferably has a spatial profile of $TEM_{00}$ mode. In the case of $TEM_{00}$ mode, the laser light has Gaussian intensity distribution and is superior in the focusing property, and therefore the beam spot can be easily transformed. Laser light emitted from the laser oscillator 101 is converted into a second harmonic (wavelength 532 nm) by the non-linear optical element 102. Although the harmonic is not particularly limited to the second harmonic, the second harmonic is preferable because it is superior in the energy efficiency to the other higher harmonics. The pulse repetition rate is set to 80 MHz and the pulse width is set to approximately 12 ps. Although the present embodiment mode uses a solid laser having an output power of approximately 1.8 W, a large laser having an output power as high as 300 W may be used. Moreover, a laser having a third harmonic that oscillates at the repetition rate of 80 MHz or more, which is often used for laser scribing or the like, may be used.

The pulse repetition rate is not limited to 80 MHz in the present invention, and it may be 10 MHz or more. Moreover, in the present invention, the upper limit of the repetition rate may be 100 GHz so as to obtain the laser light having high circularity and having the same wavefront to such a degree that the focusing property is not interrupted.

In the laser irradiation apparatus of the present invention, the non-linear optical element 102 may be provided inside the resonator of the laser oscillator 101, or the non-linear optical element may be provided outside the resonator of the laser oscillator 101. The former structure has an advantage that the size of the apparatus becomes compact and that the accurate control of the resonator length is not necessary. The latter structure has an advantage that interaction of the fundamental wave and the harmonic can be ignored.

As the non-linear optical element 102, the crystal whose non-linear optical constant is relatively large such as KTP ($KTiOPO_4$), BBO ($\beta$-$BaB_2O_4$), LBO ($LiB_3O_5$), CLBO ($CsLiB_6O_{10}$), GdYCOB ($YCa_4O(BO_3)_3$), KDP ($KD_2PO_4$), KB5, $LiNbO_3$, $Ba_2NaNb_5O_{15}$, or the like is used. Particularly, the crystal such as LBO, BBO, KDP, KTP, KB5, CLBO, or the like can increase conversion efficiency from the fundamental wave into the harmonic.

Since laser light is generally emitted to the horizontal direction, laser light emitted from the laser oscillator 101 is reflected by a reflecting mirror 103 and its traveling direction is changed so as to have an angle (incident angle) $\theta$ from the vertical direction. In this embodiment mode, the angle $\theta$ is 18°. The beam spot of the laser light whose traveling direction is changed is transformed by a lens 104 and is irradiated to a processing object mounted on a stage 107. In FIG. 1, a semiconductor film 106 formed over a substrate 105 is the processing object. Moreover, in FIG. 1, the reflecting mirror 103 and the lens 104 correspond to the optical system that condenses the laser light on the semiconductor film 106.

FIG. 1 shows an example in which a planoconvex spherical lens is used as the lens 104. The planoconvex spherical lens has a focal length of 20 mm. The planoconvex spherical lens is set so that the laser light is incident into a center of the curved surface and that the plane portion thereof is parallel to the substrate 105. The distance between the plane portion of the planoconvex spherical lens and the semiconductor film 106 is 20 mm. This forms a beam spot 110 having a size of approximately 10 μm×100 μm on the semiconductor film 106. The beam spot 110 can be extended long because of the effect of astigmatism of the lens 104.

In the case where the substrate 105 with the semiconductor film 106 formed thereover is used as the processing object as shown in FIG. 1, when the semiconductor film 106 is an amorphous semiconductor, it is preferable to perform thermal annealing to the semiconductor film 106 before the laser irradiation in order to increase the resistance of the semiconductor film 106 against the laser light. Specifically, the thermal annealing may be performed in the nitrogenous atmosphere of 500° C. for approximately 1 hour. Instead of the thermal annealing, the thermal annealing of the semiconductor film with the catalyst metal added may be performed to crystallize the semiconductor film. In both cases, the optimum condition of the laser irradiation is almost the same.

The stage 107 can move in XY directions in a plane parallel to the substrate 105 by a robot 108 for scanning in an X-axis direction (uniaxial robot for X-axis) and a robot 109 for scanning in a Y-axis direction (uniaxial robot for Y-axis).

The stage 107 is scanned in a direction of a minor axis of the beam spot 110 using the uniaxial robot 109 for Y-axis. The scanning speed of the stage 107 is appropriate in the range of approximately several tens to several thousand mm/s (more preferably, 100 to 2000 m/s), and it is set to 400 mm/s in this embodiment. The scanning of the stage 107 moves the beam spot 110 relative to the surface of the semiconductor film 106. Therefore, a region in the semiconductor film that is irradiated with the beam spot 110 is melted, and the interface between the solid phase and the liquid phase moves continuously toward the scanning direction. Thus, a plurality of crystal grains of single crystals grown in the scanning direction each having a width of several µm and a length from approximately 10 to 30 µm is formed in a paved state in a region having a width of 70 µm.

Figure 2:
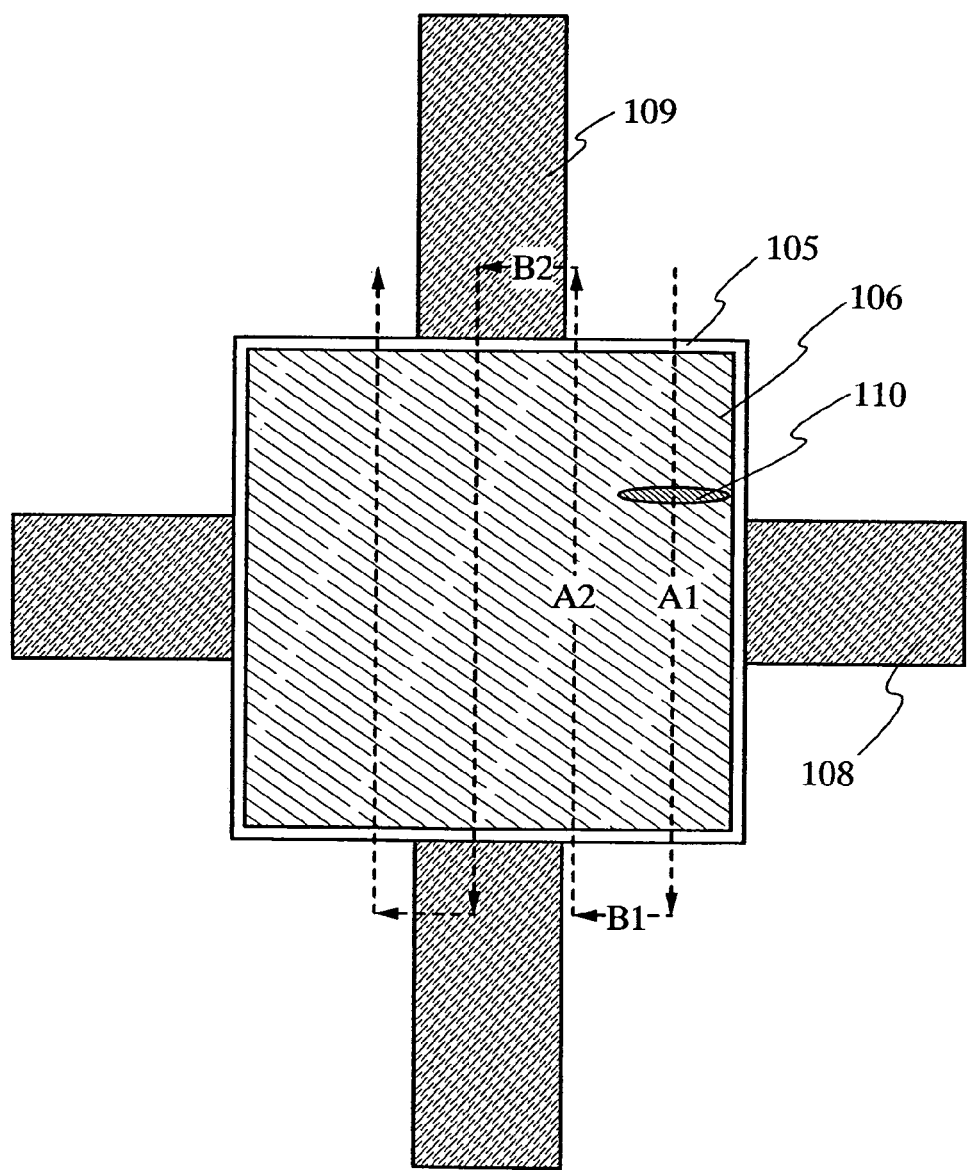
FIG. 2 is a drawing for showing a scanning route of a beam spot 110 on a semiconductor film 106.

Next, FIG. 2 shows the scanning route of the beam spot 110 on the semiconductor film 106. In the case where the whole surface of the semiconductor film 106, which corresponds to the processing object, is irradiated with the laser light, after the beam spot 110 is scanned in one direction using the uniaxial robot 109 for Y-axis, the beam spot 110 is slid using the uniaxial robot 108 for X-axis in the direction perpendicular to the direction scanned by the uniaxial robot 109 for Y-axis.

For example, the beam spot 110 is scanned in one direction by the uniaxial robot 109 for Y-axis. In FIG. 2, the scanning route is indicated by a reference character A1. Then, the beam spot 110 is slid in a direction perpendicular to the scanning route A1 using the uniaxial robot 108 for X-axis. The scanning route by the slide is indicated by a reference character B1. Next, the beam spot 110 is scanned in one direction opposite to the scanning route A1 with the use of the uniaxial robot 109 for Y-axis. This scanning route is indicated by a reference character A2. Next, the beam spot 110 is slid in a direction perpendicular to the scanning route A2 using the uniaxial robot 108 for X-axis. The scanning route by the slide here is indicated by a reference character B2. By repeating the scanning by the uniaxial robot 109 for Y-axis and the uniaxial robot 108 for X-axis in order, the whole area of the semiconductor film 106 can be irradiated with the laser light.

The region where the crystal grain grown in the scanning direction is formed by the irradiation of the laser light has very superior crystallinity. Therefore, when this region is used as the channel-forming region of the TFT, considerably high mobility and on current can be expected. However, when there is the region in the semiconductor film not requiring such high crystallinity, the laser light may not be irradiated to such a region. Alternatively, the laser light may be irradiated at higher scanning speed so that the high crystallinity is not obtained for example.

As the method for scanning the laser light, there are an irradiation system moving method in which a substrate as a processing object is fixed while an irradiated position of the laser light is moved; an object moving method in which the irradiated position of the laser light is fixed while the substrate is moved as shown in FIGS. 1 and 2; and a method in which these two methods are combined. In any case, it is necessary to control the moving direction of the beam spot relative to the semiconductor film.

Figure 3:
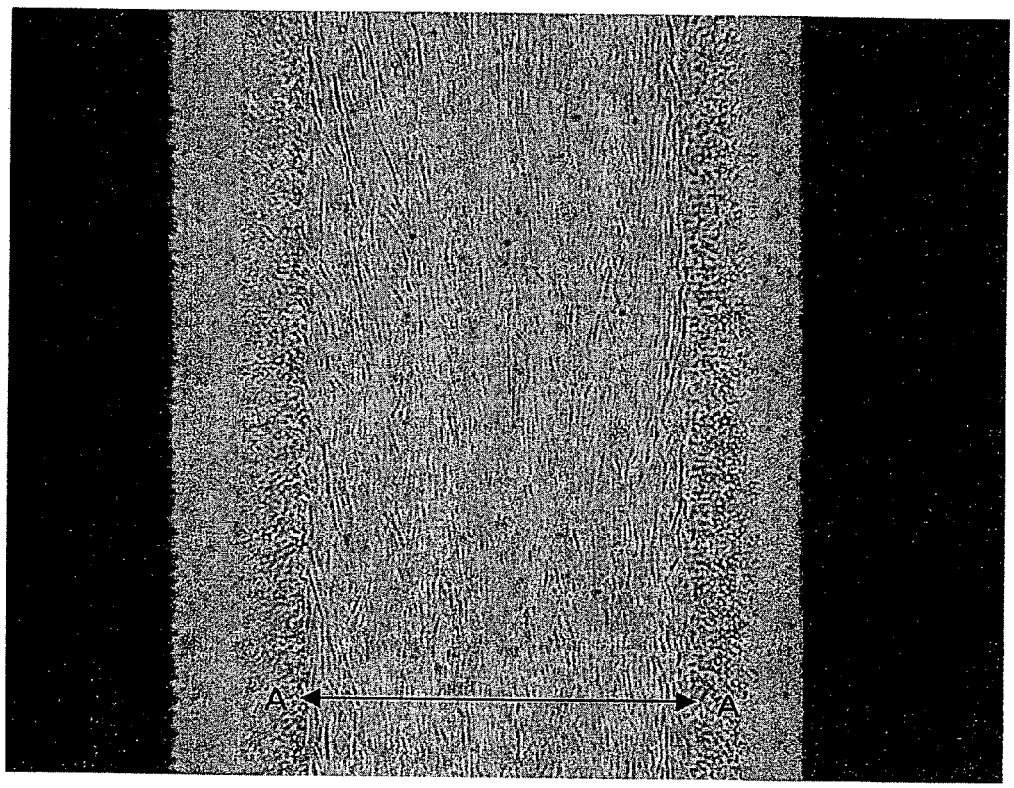
FIG. 3 is an enlarged photograph of a semiconductor film after being irradiated with the laser light with a light microscopy.

FIG. 3 is a photograph enlarged by 500 times that is taken by an optical microscope and shows a semiconductor film after being irradiated with the laser light. In FIG. 3, silicon oxide is formed in 200 nm thick on one surface of a glass substrate having a thickness of 0.7 mm, and then an amorphous silicon (a-Si) film is formed in 66 nm thick as a semiconductor film on the silicon oxide by a plasma CVD method. After that, in order to increase the resistance of the semiconductor film against the laser, thermal annealing is performed for one hour in the nitrogenous atmosphere of 500° C. Then, the laser irradiation apparatus shown in FIG. 1 is employed to crystallize the amorphous silicon film formed over the substrate under the condition where a $YVO_4$ laser has a second harmonic (532 nm) with a power of 1.8 W, a spatial profile of $TEM_{00}$ mode, a pulse repetition rate of 80 MHz, and a pulse width of 12 ps; the scanning speed is 400 mm/s; and the size of the beam spot is approximately 10 µm×100 µm.

By using the laser irradiation method of the present invention, a plurality of crystal grains including single crystals grown in the scanning direction each having a width of several µm and a length from approximately 10 to 30 µm is formed in a paved state in a region having a width of 70 µm that is indicated by a line A-A' shown in FIG. 3.

In order to compare, another laser crystallization is performed under the condition where a $YVO_4$ laser has a second harmonic (532nm) with a power of 18 W, the spatial profile of $TEM_{00}$ mode, a pulse repetition rate of 100 kHz, and a pulse width of 40ns; the scanning speed is 200 mm/s; and the size of the beam spot is approximately 7 µm ×6 mm. In this case, a crystal grain formed by pulsed laser light and a crystal grain formed by the next pulsed laser light are not connected at a crystal level, and the crystal formed in the region indicated by A-A' in FIG. 3 is not obtained.

Embodiment 1

Figure 4A:
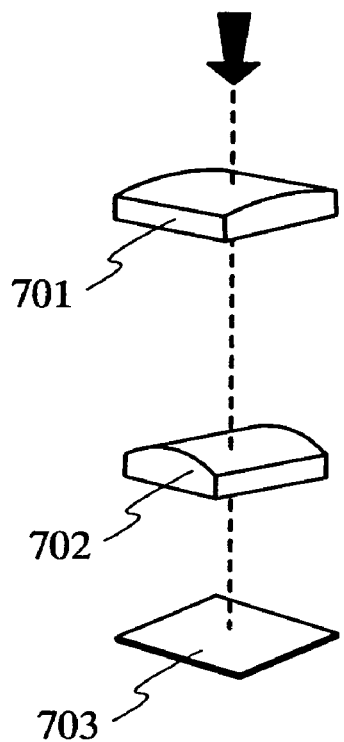
FIGS. 4A and 4B are drawings for showing examples of the optical system in the laser irradiation apparatus of the present invention.
Figure 4B:
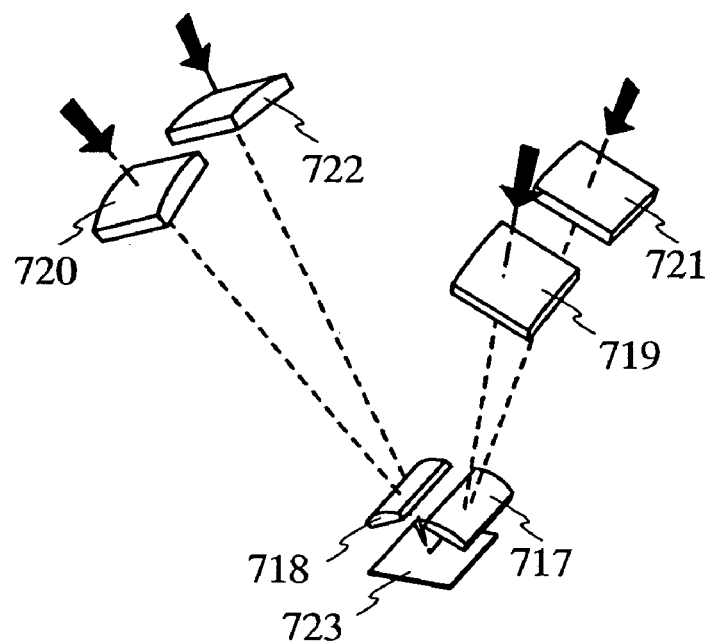

This embodiment explains an optical system in the laser irradiation apparatus of the present invention with reference to FIGS. 4A and 4B.

The optical system shown in FIG. 4A has two cylindrical lenses 701 and 702. The beam spot of the laser light incident from the direction indicated by an arrow is shaped by the cylindrical lenses 701 and 702 and then it is irradiated to a processing object 703. It is noted that the cylindrical lens 702 closer to the processing object 703 has a shorter focal length than the cylindrical lens 701.

When the laser having a pulse width of approximately 10 ps is used according to the present invention, the optical system can be set without considering the effect of the interference. In other words, the laser light may be made incident into the processing object 703 vertically.

FIG. 4B shows an optical system for combining four beam spots into one beam spot. The optical system shown in FIG. 4B has six cylindrical lenses 717 to 722. The four laser light being incident from directions indicated by the arrows are incident into the four cylindrical lenses 719 to 722 respectively. The two laser light shaped by the cylindrical lenses 719 and 721 are shaped again by the cylindrical lens 717, and they are irradiated to the processing object 723. On the other hand, the two laser light shaped by the cylindrical lenses 720 and 722 are shaped again by the cylindrical lens 718, and they are irradiated to a processing object 723.

The beam spots on the processing object 723 overlap each other partially to form one beam spot.

Although a designer can set the focal length of the lenses and the incidence angle appropriately, the focal length of the cylindrical lenses 717 and 718, which are the closest to the processing object 723, should be shorter than that of the cylindrical lenses 719 to 722. For example, the focal length of the cylindrical lenses 717 and 718 is set to 20 mm, and the focal length of the cylindrical lenses 719 to 722 is set to 150 mm. The cylindrical lenses are set so that the laser light emitted from the cylindrical lenses 719 to 722 are incident into the cylindrical lenses 717 and 718 at an angle of 10° and the laser light emitted from the cylindrical lenses 717 and 718 are incident into the processing object 723 at an angle of 25°.

FIG. 4B shows an example in which four beam spots are combined. In this case, four cylindrical lenses are provided to correspond with four laser oscillators, and two cylindrical lenses are provided to correspond with the four cylindrical lenses. The number of beam spots to be combined is not limited to this, and the number thereof may be no fewer than 2 nor more than 8. When n (n=2, 4, 6, 8) number of the beam spots are combined, n number of the cylindrical lenses are provided to correspond with n number of the laser oscillators respectively, and n/2 number of the cylindrical lenses are provided to correspond with n number of the cylindrical lenses. When n (n=3, 5, 7) number of the beam spots are combined, n number of the cylindrical lenses are provided to correspond with n number of the laser oscillators respectively, and (n+1)/2 number of the cylindrical lenses are provided to correspond with n number of the cylindrical lenses.

When five or more of the beam spots are overlapped, it is desirable that the fifth and subsequent laser light are irradiated from the side of the rear surface of the substrate in consideration of the position of the optical system, interference, and the like. Moreover, the substrate is necessarily transparent.

The optical system in the laser irradiation apparatus of the present invention is not limited to that shown in this embodiment.

Embodiment 2

This embodiment explains a laser irradiation method and a method for manufacturing a semiconductor device of the present invention with reference to FIGS. 5A to 5C.

Initially, a base film 501 is formed on a substrate 500 as shown in FIG. 5A. A glass substrate such as a barium borosilicate glass or an alumino borosilicate glass, a quartz substrate, a stainless substrate, or the like can be used as the substrate 500 for example. In addition, although a substrate made of flexible synthetic resin such as acrylic or plastic typified by PET, PES, or PEN tends to be inferior to the above substrates in point of the resistance against the heat, the substrate made of flexible synthetic resin can be used when it can resist the heat generated in the manufacturing process.

The base film 501 is provided in order to prevent the alkali-earth metal or alkali metal such as Na included in the substrate 500 from diffusing into the semiconductor film. The alkali-earth metal or the alkali metal causes an adverse effect on the characteristic of the semiconductor element when it is in the semiconductor film. Therefore, the base film is formed of an insulating material such as silicon oxide, silicon nitride, or silicon nitride oxide, which can suppress the diffusion of the alkali-earth metal and alkali metal into the semiconductor film. In the present embodiment, a silicon nitride oxide film is formed in thickness from 10 to 400 nm (preferably from 50 to 300 nm) by a plasma CVD method.

It is noted that the base film 501 may be formed of a single insulating film or may be formed by laminating a plurality of insulating films. In the case of using the substrate including the alkali metal or the alkali-earth metal in any way such as the glass substrate, the stainless substrate, or the plastic substrate, it is effective to provide the base film in terms of preventing the diffusion of the impurity. When the substrate such as the quartz substrate that hardly diffuses the impurity is used, the base film is not always necessary to be provided.

Next, a semiconductor film 502 is formed on the base film 501 in thickness from 25 to 100 nm (preferably from 30 to 60 nm). The semiconductor film 502 may be an amorphous semiconductor or a poly-crystalline semiconductor. Moreover, not only silicon but also silicon germanium can be used as the semiconductor. When silicon germanium is used, it is preferable that the density of germanium is in the range of approximately 0.01 to 4.5 atomic %.

Next, the laser irradiation apparatus of the present invention is used to irradiate the semiconductor film 502 with the laser light and to crystallize it as shown in FIG. 5B.

In this embodiment, the laser irradiation is performed using a $YVO_4$ laser that provides 2 W at 532 nm (second harmonic) with a repetition rate of 80 MHz, a pulse width of 12 ps, and a spatial profile of $TEM_{00}$ mode. Moreover, a beam spot 510 formed on the semiconductor film 502 by shaping the laser light through an optical system has a rectangular shape of 10 μm in a short side and 100 μm in a long side. The condition of the laser irradiation is not limited to that shown in this embodiment.

Then, the beam spot 510 is scanned on the semiconductor film 502 in a direction indicated by a white arrow shown in FIG. 5B. By setting the pulse repetition rate to 80 MHz, the interface between the solid phase and the liquid phase can be moved continuously to the direction indicated by the white arrow. Therefore, the crystal grain grown continuously toward the scanning direction is formed. By forming a grain of the single crystal extending long in the scanning direction, it is possible to form the semiconductor film having almost no crystal grain boundary at least in the channel direction of the TFT.

A semiconductor film 503 having the crystallinity further enhanced is formed by irradiating the semiconductor film 502 with the laser light as described above.

Next, the semiconductor film 503 is patterned to form island-shaped semiconductor films 507 to 509 as shown in FIG. 5C. The island-shaped semiconductor films 507 to 509 are used to form various semiconductor elements typified by a TFT.

In the case of manufacturing the TFT, a gate insulating film (not illustrated in the figure) is formed to cover the island-shaped semiconductor films 507 to 509. The gate insulating film can be formed of silicon oxide, silicon nitride, silicon nitride oxide, or the like by the plasma CVD method, the sputtering method, or the like.

Next, a gate electrode is formed by forming a conductive film on the gate insulating film and patterning it. Then, a source region, a drain region, an LDD region, and the like are formed by adding an impurity imparting n-type or p-type conductivity to the island-shaped semiconductor films 507 to 509 using the gate electrode as a mask or using the resist to be formed and patterned as a mask.

The above process can form the TFT. The method for manufacturing a semiconductor device of the present invention is not limited to the manufacturing process of the TFT after forming the island-shaped semiconductor films shown in this embodiment. When the semiconductor film crystallized by the laser irradiation method of the present invention is used as an active layer of the TFT, it is possible to suppress the variation of the mobility, threshold, and on-current between the semiconductor elements.

Before the laser crystallization step, a crystallization step using the catalyst element may be performed. As the catalyst element, nickel (Ni), germanium (Ge), iron (Fe), palladium (Pd), tin (Sn), lead (Pb), cobalt (Co), platinum (Pt), copper (Cu), or gold (Au) can be used. When the laser crystallization is performed after the crystallization using the catalyst element, the laser irradiation melts an upper part of the semiconductor film but does not melt a lower part of the semiconductor film. Therefore, a crystal remained without being melted in the lower part of the semiconductor film becomes a crystal nucleus, and the crystallization is promoted uniformly from the lower part toward the upper part of the semiconductor film. Compared to the case in which the semiconductor film is crystallized only by the laser light, it is possible to enhance the crystallinity of the semiconductor film further and to suppress the roughness of the surface of the semiconductor film after the laser crystallization. Therefore, the variation of the characteristics of the semiconductor element to be formed afterward typified by a TFT can be more suppressed and the off current can be also suppressed.

It is noted that the crystallization may be performed in such a way that the heat treatment is performed after the catalyst element is added in order to promote the crystallization and then the laser light is irradiated in order to enhance the crystallinity further. Alternatively, the heat treatment may be omitted. Specifically, after adding the catalyst element, the laser light may be irradiated to the semiconductor film instead of the heat treatment to enhance the crystallinity.

Although the present embodiment shows an example in which the laser irradiation method of the present invention is used to crystallize the semiconductor film, the laser irradiation method may be applied to activate the impurity element doped in the semiconductor film.

Embodiment 3

Unlike the embodiment 2, this embodiment explains an example in which the crystallization method by the laser irradiation apparatus of the present invention is combined with the crystallization method by the catalyst element.

Figure 6A:
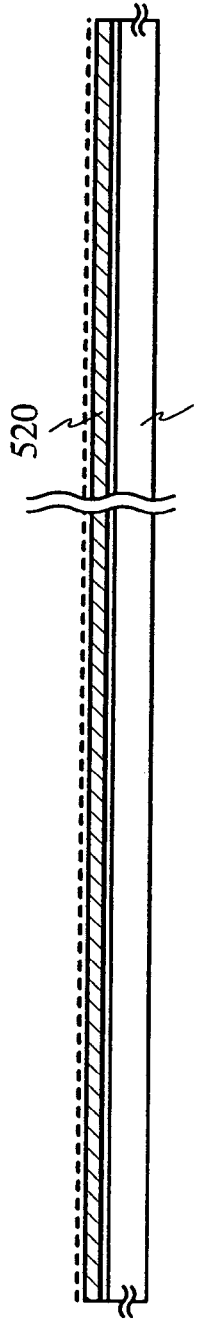
FIGS. 6A to 6D are drawings for showing a laser irradiation method and a method for manufacturing a semiconductor device of the present invention.

Initially, the process up to forming the semiconductor film 502 is performed with reference to FIG. 5A of the embodiment 2. Next, as shown in FIG. 6A, a nickel acetate solution including Ni in the range of 1 to 100 ppm in weight is applied to the surface of the semiconductor film 502 by a spin coating method. It is noted that the catalyst may be added not only by the above method but also by another method such as a sputtering method, a vapor deposition method, or a plasma process. Next, the heat treatment is performed for 4 to 24 hours at temperatures ranging from 500 to 650° C., for example for 14 hours at a temperature of 570° C. This heat treatment forms a semiconductor film 520 in which the crystallization is promoted in the vertical direction from the surface with the nickel acetate solution applied thereon toward the substrate 500 (FIG. 6A).

The heat treatment is performed for example at a temperature of 740° C. for 180 seconds by RTA (Rapid Thermal Anneal) using radiation of the lamp as a heat source or by RTA using heated gas (gas RTA). The set temperature is the temperature of the substrate measured by a pyrometer, and the measured temperature is herein defined as the set temperature in the heat treatment. As another method, the heat treatment using an annealing furnace at a temperature of 550° C. for 4 hours may be employed. It is the action of the metal element having the catalytic activity that lowers the temperature and shortens the time in the crystallization.

Although the present embodiment uses nickel (Ni) as the catalyst element, another element such as germanium (Ge), iron (Fe), palladium (Pd), tin (Sn), lead (Pb), cobalt (Co), platinum (Pt), copper (Cu), or gold (Au) may be also used.

Figure 6B:
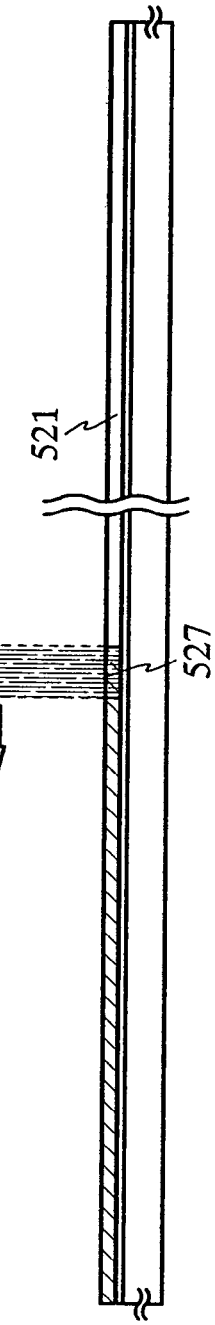

Subsequently, the semiconductor film 520 is crystallized using the laser irradiation apparatus of the present invention as shown in FIG. 6B. In this embodiment, the second harmonic of a pulsed YVO$_4$ laser with a repetition rate of 80 MHz and a pulse width of approximately 12 ps is used. A beam spot 527 formed on the semiconductor film 520 by shaping the laser light through the optical system has a rectangular shape of 10 μm in a short side and 100 μm in a long side. However, the condition of the laser irradiation of the present invention is not limited to that shown in this embodiment.

The beam spot 527 is scanned on a surface of the semiconductor film 520 in a direction indicated by a white arrow shown in FIG. 6B. By setting the pulse repetition rate to 80 MHz, the interface between the solid phase and the liquid phase can be moved continuously to the direction indicated by the white arrow. Thus, the crystal grain grown continuously toward the scanning direction is formed. When the grain of the single crystal extending long in the scanning direction is formed, it is possible to form a semiconductor film having almost no crystal grain boundary at least in the channel direction of the TFT.

By the irradiation of the laser light to the semiconductor film 520 as described above, a semiconductor film 521 in which the crystallinity is enhanced further is formed. It is considered that the semiconductor film 521 crystallized using the catalyst element includes the catalyst element (herein Ni) at the density of approximately $1 \times 10^{19}$ atoms/cm$^3$. Therefore, the gettering of the catalyst element existing in the semiconductor film 521 is performed next.

Figure 6C:
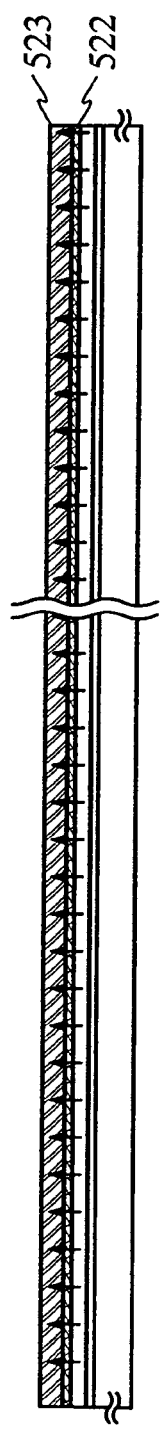

Initially, an oxide film 522 is formed on a surface of the semiconductor film 521 as shown in FIG. 6C. By forming the oxide film 522 in thickness from approximately 1 to 10 nm, it is possible to prevent the surface of the semiconductor film 521 from becoming rough in the following etching process. The oxide film 522 can be formed by a known method. For example, the oxide film 522 may be formed by oxidizing the surface of the semiconductor film 521 using ozone water or using the solution in which hydrogen peroxide solution is mixed with sulfuric acid, hydrochloric acid, nitric acid, or the like. Alternatively, the oxide film 522 may be formed by the plasma process, heat treatment, or ultraviolet ray irradiation in the atmosphere including oxygen. Moreover, the oxide film 522 may be formed separately by the plasma-CVD method, the sputtering method, the vapor deposition method, or the like.

A semiconductor film 523 for the gettering including the noble gas element at the density of $1 \times 10^{20}$ atoms/cm$^3$ or more is formed in thickness from 25 to 250 nm on the oxide film 522 by the sputtering method. It is desirable that the mass density of the semiconductor film 523 for the gettering is lower than that of the semiconductor film 521 in order to increase the selecting ratio to the semiconductor film 521 when being etched. As the noble gas element, one or a plurality of elements selected from the group consisting of helium (He), neon (Ne), argon (Ar), krypton (Kr), and xenon (Xe) is used.

Next, the gettering is performed by the heat treatment according to the furnace annealing method or the RTA method. When the furnace annealing method is employed, the heat treatment is performed for 0.5 to 12 hours at temperatures from 450 to 600° C. in the atmosphere of nitrogen.

When the RTA method is employed, a lamp light source for heating is turned on for 1 to 60 seconds, preferably from 30 to 60 seconds, which is repeated from 1 to 10 times, preferably from 2 to 6 times. The luminance intensity of the lamp light source is set so that the semiconductor film is heated instantaneously at temperatures ranging from 600 to 1000° C., preferably from approximately 700 to 750° C.

Through the heat treatment, the catalyst element inside the semiconductor film 521 is moved to the semiconductor film 523 for the gettering due to the diffusion as indicated by an arrow, and the catalyst element is thus gettered.

Next, the semiconductor film 523 for the gettering is removed by etching selectively. The etching process is performed by dry etching using $ClF_3$ not applying plasma or by wet etching using an alkali solution such as the solution including hydrazine or tetraethylammonium hydroxide (chemical formula $(CH_3)_4NOH$). On this occasion, the oxide film 522 can prevent the semiconductor film 521 from being etched.

Figure 6D:
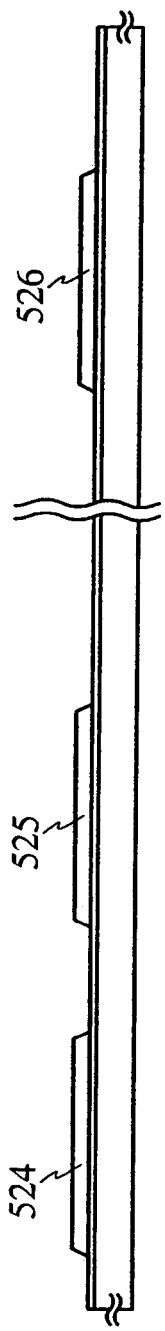

Next, after removing the oxide film 522 by hydrofluoric acid, the semiconductor film 521 is patterned to form island-shaped semiconductor films 524 to 526. (FIG. 6(D)) Various semiconductor elements, typically TFT, can be formed using these island-shaped semiconductor films 524 to 526. It is noted that the gettering method is not limited to that shown in this embodiment. Another method may be also employed to decrease the catalyst element in the semiconductor film.

In this embodiment, the laser irradiation melts an upper part of the semiconductor film but does not melt a lower part of the semiconductor film. Therefore, a crystal remained without being melted in the lower part of the semiconductor film becomes a crystal nucleus, and the crystallization is promoted uniformly from the lower part toward the upper part of the semiconductor film. Moreover, the crystal orientation is easily aligned. Therefore, the surface of the semiconductor film is prevented from becoming rough compared with the case of the embodiment 2. Moreover, the variation of the characteristic of the semiconductor element to be formed afterward, typically TFT, can be more suppressed.

It is noted that this embodiment explained the process to promote crystallization by performing the heat treatment after the catalyst element is added and to enhance crystallinity further by irradiating the laser light. However, the present invention is not limited to this, and the heat treatment may be omitted. Specifically, after adding the catalyst element, the laser light may be irradiated instead of the heat treatment in order to enhance the crystallinity.

Embodiment 4

This embodiment also explains an example in which the crystallization method by the laser irradiation apparatus of the present invention is combined with the crystallization method by the catalyst element. However, the example explained here is different from the embodiment 3.

Figure 7A:
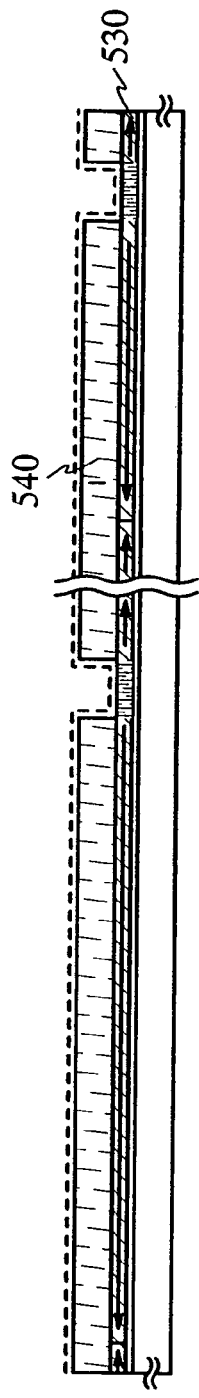
FIGS. 7A to 7D are drawings for showing a laser irradiation method and a method for manufacturing a semiconductor device of the present invention.

Initially, the process up to forming the semiconductor film 502 is performed with reference to FIG. 5A of the embodiment 2. Next, a mask 540 having an opening is formed on the semiconductor film 502. Then, a nickel acetate solution including Ni in the range of 1 to 100 ppm in weight is applied to the surface of the semiconductor film 502 by a spin coating method. The catalyst element may be applied not only by the above method but also by the sputtering method, the vapor deposition method, the plasma process, or the like. The nickel acetate solution contacts the semiconductor film 502 through the opening of the mask 540 (FIG. 7A).

Next, a heat treatment is performed for 4 to 24 hours at temperatures from 500 to 650° C., for example for 14 hours at a temperature of 570° C. This heat treatment forms a semiconductor film 530 in which the crystallization is promoted from the surface with the nickel acetate solution applied thereon as indicated by a continuous line (FIG. 7A). The heat treatment may be performed not only by the above method but also by another method such as the method shown in the embodiment 3. As the catalyst element, elements recited in the embodiment 3 can be used.

Figure 7B:
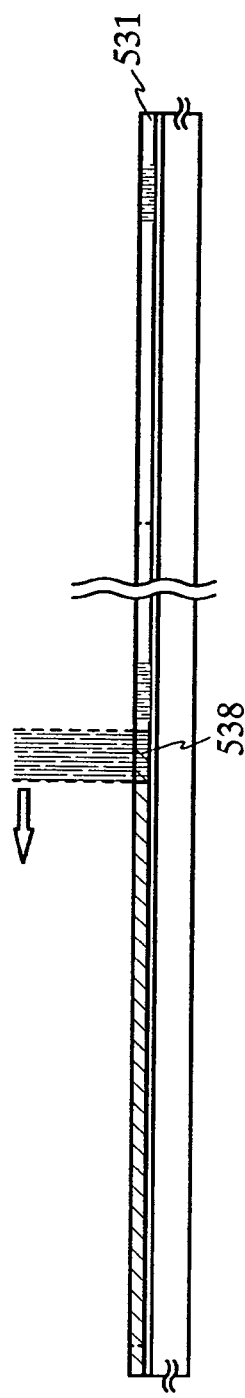

Subsequently, after removing the mask 540, the semiconductor film 530 is crystallized using the laser irradiation apparatus of the present invention as shown in FIG. 7B. In this embodiment, a $YVO_4$ laser providing 2 W at 532 nm (second harmonic) with a repetition rate of 80 MHz and a pulse width of 12 ps is used. It is noted that a beam spot 538 formed on the semiconductor film 530 by shaping the laser light through an optical system has a rectangular shape of 10 μm in a short side and 100 μm in a long side. However, the condition of the laser irradiation is not limited to that shown in this embodiment.

The beam spot 538 is scanned on the semiconductor film 530 in a direction indicated by a white arrow shown in FIG. 7B. By setting the pulse repetition rate to 80 MHz, it is possible to move the interface between the solid phase and the liquid phase continuously in the direction indicated by the white arrow and therefore to form the crystal grain grown continuously in the scanning direction. When the grain of the single crystal extending long in the scanning direction is formed, it is possible to form a semiconductor film having almost no crystal grain at least in the channel direction of the TFT.

By irradiating the semiconductor film 530 with the laser light, a semiconductor film 531 in which the crystallinity is further enhanced is formed.

It is considered that the semiconductor film 531 crystallized using the catalyst element includes the catalyst element (herein Ni) at the density of approximately $1 \times 10^{19}$ atoms/$cm^3$. Therefore, the gettering of the catalyst element existing in the semiconductor film 531 is performed next.

Figure 7C:
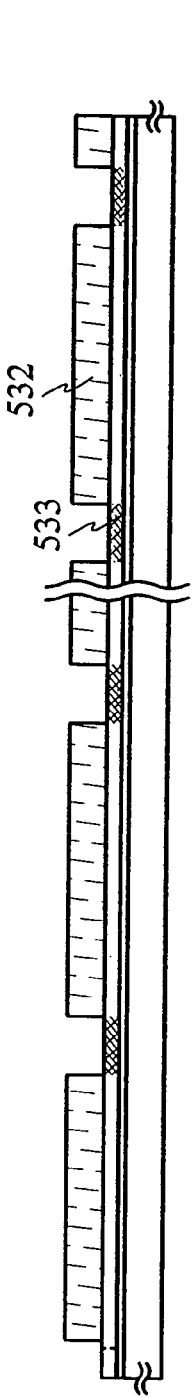

Initially, as shown in FIG. 7C, a silicon oxide film 532 for the mask is formed in 150 nm thick so as to cover the semiconductor film 531. Then, the silicon oxide film 532 is patterned to form an opening so that a part of the semiconductor film 531 is exposed. Then, phosphorous is added to the exposed part of the semiconductor film 531 to form a region 533 with the phosphorus added. When a heat treatment is performed in this state for 5 to 24 hours at temperatures from 550 to 800° C., for example for 12 hours at a temperature of 600° C., the region 533 with the phosphorus added works as a gettering site, and the catalyst element left in the semiconductor film 531 moves to the gettering region 533 with the phosphorous added.

Figure 7D:
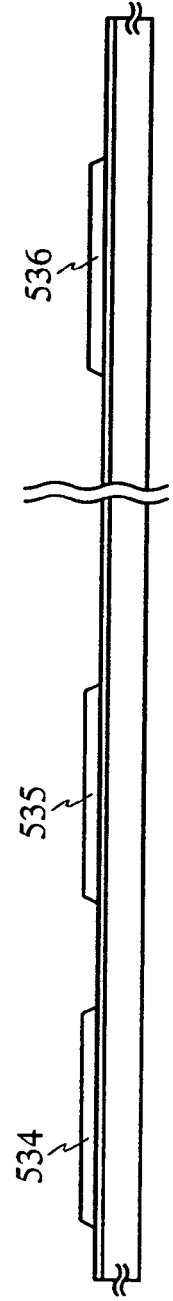

By etching away the region 533 with the phosphorous added, the density of the catalyst element can be lowered to be $1 \times 10^{17}$ atoms/$cm^3$ or less in the rest of the semiconductor film 531. Next, after removing the silicon oxide film 532 for the mask, the semiconductor film 531 is patterned to form island-shaped semiconductor films 534 to 536 (FIG. 7D). These island-shaped semiconductor films 534 to 536 can be used to form various semiconductor elements typified by a TFT. The gettering method is not limited to that shown in this embodiment. Another method may be also employed to decrease the catalyst element in the semiconductor film.

In this embodiment, the laser irradiation melts an upper part of the semiconductor film but does not melt a lower part of the semiconductor film. Therefore, a crystal remained without being melted in the lower part of the semiconductor film becomes a crystal nucleus, and the crystallization is promoted uniformly from the lower part toward the upper part of the semiconductor film. Moreover, the crystal orientation is easily aligned. Thus, the surface of the semiconductor film is prevented from becoming rough compared with the case of the embodiment 2. Therefore, the variation of the characteristic of the semiconductor element to be formed afterward, typically TFT, can be suppressed.

It is noted that this embodiment explained the process to promote crystallization by performing the heat treatment after the catalyst element is added and to enhance crystallinity further by irradiating the laser light. However, the present invention is not limited to this, and the heat treatment may be omitted. Specifically, after adding the catalyst element, the laser light may be irradiated instead of the heat treatment in order to enhance the crystallinity.

Embodiment 5

Figure 8:
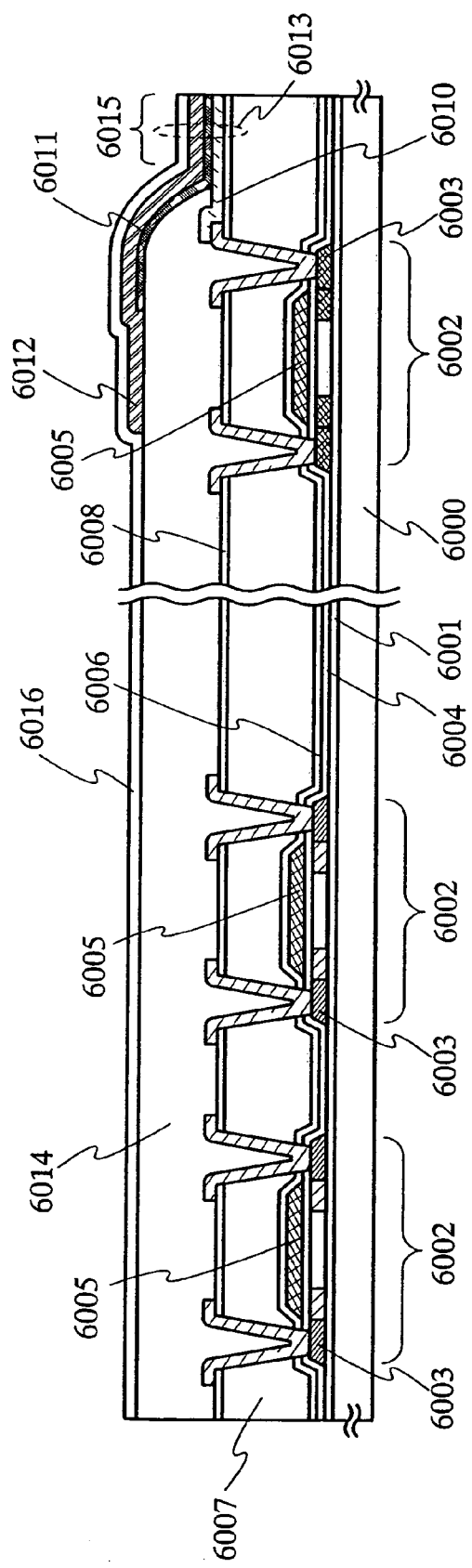
FIG. 8 is a drawing for showing a pixel structure of a light-emitting device, which is one of the semiconductor display devices formed using the laser irradiation apparatus of the present invention.

This embodiment explains with reference to FIG. 8 a pixel structure of a light-emitting device, which is one of semiconductor display devices that can be manufactured using the laser irradiation apparatus.

In FIG. 8, a base film 6001 is formed on a substrate 6000, and a transistor 6002 is formed on the base film 6001. The transistor 6002 has an island-shaped semiconductor film 6003, a gate electrode 6005, and a gate insulating film 6004 sandwiched between the island-shaped semiconductor film 6003 and the gate electrode 6005.

The island-shaped semiconductor film 6003 is a poly-crystalline semiconductor film that is crystallized by the laser irradiation apparatus of the present invention. The island-shaped semiconductor film may be formed of not only silicon but also silicon germanium. When the silicon germanium is used, it is preferable that the density of the germanium is in the range of approximately 0.01 to 4.5 atomic %. Moreover, silicon with carbon nitride added may be used.

As the gate insulating film 6004, silicon oxide, silicon nitride, or silicon oxynitride can be used. Moreover, the gate insulating film 6004 may be formed by laminating these materials. For example, a film in which SiN is formed on $SiO_2$ may be used as the gate insulating film. The gate electrode 6005 is formed of an element selected from the group consisting of Ta, W, Ti, Mo, Al, and Cu or formed of an alloy material or a chemical compound material including the above element as its main component. Furthermore, a semiconductor film typified by a poly-crystalline silicon film with an impurity element such as phosphorus doped may be used as the gate electrode 6005. Not only a single conductive film but also a conductive film including a plurality of layers may be used as the gate electrode 6005.

The transistor 6002 is covered by a first interlayer insulating film 6006. A second interlayer insulating film 6007 and a third interlayer insulating film 6008 are formed on the first interlayer insulating film 6006 in order. The first interlayer insulating film 6006 may be a single layer or multilayer formed of silicon oxide, silicon nitride, or silicon oxynitride by the plasma CVD method or the sputtering method.

The second interlayer insulating film 6007 can be formed of an organic resin film, an inorganic insulating film, an insulating film that includes Si—$CH_x$ bond and Si—O bond made from the material selected from the siloxane group, or the like. In this embodiment, non-photosensitive acrylic is used. The third interlayer insulating film 6008 is formed of the material that is hard to transmit the substance causing to promote deterioration of the light-emitting element such as moisture, oxygen, and the like compared with another insulating film. Typically, it is preferable to use a DLC film, a carbon nitride film, a silicon nitride film formed by the RF sputtering method, or the like.

In FIG. 8, a reference numeral 6010 denotes a first electrode, a reference numeral 6011 denotes an electroluminescent layer, a reference numeral 6012 denotes a second electrode, and the part in which the first electrode 6010, the electroluminescent layer 6011, and the second electrode 6012 are overlapped corresponds to a light-emitting element 6013. One of the transistors 6002 is a driver transistor for controlling the current supplied to the light-emitting element 6013, and it is connected directly or serially through another circuit element to the light-emitting element 6013. The electroluminescent layer 6011 is a single light-emitting layer or multilayer including the light-emitting layer.

The first electrode 6010 is formed on the third interlayer insulating film 6008. An organic resin film 6014 is formed as the partition wall on the third interlayer insulating film 6008. Although the present embodiment uses the organic resin film as the partition wall, an inorganic insulating film, an insulating film that includes Si—$CH_x$ bond and Si—O bond made from the material selected from the siloxane group, or the like can be also used as the partition wall. The organic resin film 6014 has an opening portion 6015, and the light-emitting element 6013 is formed by overlapping the first electrode 6010, the electroluminescent layer 6011, and the second electrode 6012 in the opening portion 6015.

A protective film 6016 is formed on the organic resin film 6014 and the second electrode 6012. As well as the third interlayer insulating film 6008, the protective film 6016 is formed of the material that is hard to transmit the substance causing to promote deterioration of the light-emitting element such as moisture and oxygen compared with another insulating film. For example, a DLC film, a carbon nitride film, a silicon nitride film formed by the RF sputtering method, or the like is used as the protective film 6016.

It is preferable to make the edge portion of the opening 6015 of the organic resin film 6014 round so as to prevent the electroluminescent layer 6011 partially overlapping the organic resin film 6014 from staving. More specifically, it is desirable that the sectional surface of the organic resin film at the edge of the opening has a radius of curvature ranging from approximately 0.2 to 2 µm. With the above structure, the coverage of the electroluminescent layer and the second electrode to be formed afterward can be improved, and it is possible to prevent a short circuit between the first electrode 6010 and the second electrode 6012 in the hole formed in the electroluminescent layer 6011 from forming. Moreover, when the stress of the electroluminescent layer 6011 is relaxed, it is possible to decrease the defect called shrink in which the light-emitting region decreases and to enhance the reliability.

FIG. 8 shows an example using positive photosensitive acrylic resin as the organic resin film 6014. In the photosensitive organic resin, there are the positive type in which the region where the energy such as light, electron, or ion is exposed is removed and the negative type in which the region that is exposed is not removed. The negative organic resin film may be used in the present invention. Moreover, a photosensitive polyimide may be used to form the organic resin film 6014. In the case of forming the organic resin film 6014 using the negative acrylic, the edge portion of the opening portion 6015 shapes like a letter of S. On this occasion, it is desirable that the radius of curvature in the upper portion and the lower portion of the opening portion is in the range of 0.2 to 2 µm.

It is noted that one of the first electrode 6010 and the second electrode 6012 is an anode and the other one of them is a cathode.

The anode can be formed of a light-transmitting conductive oxide material such as indium tin oxide (ITO), zinc oxide (ZnO), indium zinc oxide (IZO), or gallium-doped zinc oxide (GZO). Moreover, ITO, indium tin oxide including silicon oxide (hereinafter referred to as ITSO), or indium oxide including silicon oxide in which zinc oxide (ZnO) is added in the range of 2 to 20% may be used. Furthermore, the anode may be a single layer including one or a plurality of elements selected from the group consisting of TiN, ZrN, Ti, W, Ni, Pt, Cr, Ag, Al, and the like; two layers formed by laminating a film mainly including titanium nitride and a film mainly including aluminum; three layers formed by laminating a titanium nitride film, a film mainly including aluminum, and a titanium nitride film; or the like. When the anode is formed of a material different from the light-transmitting conductive oxide material and when the light is emitted from the anode side, the anode is formed in the thickness of such a degree that the light can transmit (preferably from approximately 5 to 30 nm).

The cathode can be formed of a metal, an alloy, a conductive compound, or a mixture of these materials each having low work function. Specifically, the cathode can be formed of an alkali metal such as Li or Cs; an alkali-earth metal such as Ca, Sr, or Mg; an alloy including these such as Mg:Ag, Al:Li, or Mg:In; a chemical compound of these such as $CaF_2$ or CaN; or rare-earth metal such as Yb or Er. When an electron-injecting layer is provided in the electroluminescent layer 6011, a conductive layer such as Al can be used. When the light is emitted from the cathode side, the cathode may be formed of a light-transmitting conductive oxide material such as the indium tin oxide (ITO), zinc oxide (ZnO), indium zinc oxide (IZO), gallium-doped zinc oxide (GZO), or the like. Moreover, the cathode may be formed of ITO, indium tin oxide including silicon oxide (hereinafter referred to as ITSO), or indium oxide including silicon oxide in which zinc oxide (ZnO) is further mixed in the range of 2 to 20%. In the case of using the light-transmitting conductive oxide material, the electron-injecting layer is preferably provided to the electroluminescent layer 6011 to be formed afterward. By forming the cathode in the thickness of such a degree that the light can transmit (preferably from approximately from 5 to 30 nm) without the use of the light-transmitting conductive oxide material, the light can be taken from the cathode side. In this case, the sheet resistance of the cathode may be suppressed by forming a light-transmitting conductive film using the light-transmitting conductive oxide material so as to contact the upper part or the lower part of the cathode.

Although FIG. 8 shows the structure in which the light emitted from the light-emitting element is irradiated to the side of the substrate 6000, the light-emitting element may have a structure in which the light is irradiated to the side opposite to it.

After the light-emitting device shown in FIG. 8 is obtained, it is preferable to package (enclose) the light-emitting device using a protective film (laminate film, ultraviolet curable resin film, or the like) or a light-transmitting cover member that is highly airtight and hardly degases. The reliability of the light-emitting element is enhanced when the inside of the cover member is filled with the inert atmosphere or the material having moisture-absorption characteristic (barium oxide, for example) is set in the cover member.

Although the present embodiment shows the light-emitting device as an example of the semiconductor display device, the semiconductor display device formed using the manufacturing method of the present invention is not limited to this.

What is claimed is:

1. A laser irradiation apparatus comprising:
   a pulsed laser oscillator configured to supply a laser light;
   an optical system configured to introduce the laser light to a processing object,
   wherein the pulsed laser introduced to the processing object has a pulse repetition rate of 10 MHz or more, and
   wherein an inequality of ct<2nd is satisfied where c is a speed of light in vacuum, n is a refractive index of a substrate with the processing object formed thereover, d is a thickness of the substrate, and t is a pulse width of the laser light.

2. The laser irradiation apparatus according to claim 1 further comprising a stage for irradiating the laser light to a processing object,
   wherein a scanning speed of the stage is in the range of several tens to several thousand mm/s.

3. The laser irradiation apparatus according to claim 1 further comprising a stage for irradiating the laser light to a processing object,
   wherein a scanning speed of the stage is 100 to 2000 mm/s.

4. The laser irradiation apparatus according to claim 1, wherein the processing object comprises a semiconductor film.

5. A laser irradiation apparatus comprising:
   a pulsed laser oscillator configured to supply a laser light;
   an optical system configured to introduce the laser light to a processing object,
   wherein the pulsed laser introduced to the processing object has a pulse repetition rate from 10 MHz to 100 GHz, and
   wherein an inequality of ct<4nd is satisfied where c is a speed of light in vacuum, n is a refractive index of a substrate with the processing object formed thereover, d is a thickness of the substrate, and t is a pulse width of the laser light.

6. The laser irradiation apparatus according to claim 5 further comprising a stage for irradiating the laser light to a processing object,
   wherein a scanning speed of the stage is in the range of several tens to several thousand mm/s.

7. The laser irradiation apparatus according to claim 5 further comprising a stage for irradiating the laser light to a processing object,
   wherein a scanning speed of the stage is 100 to 2000 mm/s.

8. The laser irradiation apparatus according to claim 5, wherein the processing object comprises a semiconductor film.

9. A laser irradiation apparatus comprising:
   a pulsed laser oscillator configured to supply a laser light;
   a non-linear optical element configured to convert a wavelength of the laser light; and
   an optical system configured to introduce the laser light whose wavelength is converted to a processing object, and to condense the laser light whose wavelength is converted on a processing object,
   wherein the pulsed laser introduced to the processing object has a pulse repetition rate of 10 MHz or more, and
   wherein an inequality of ct<2nd is satisfied where c is a speed of light in vacuum, n is a refractive index of a substrate with the processing object formed thereover, d is a thickness of the substrate, and t is a pulse width of the laser light.

10. The laser irradiation apparatus according to claim 9, wherein the laser light whose wavelength is converted has a second harmonic.

11. The laser irradiation apparatus according to claim 9, wherein the processing object comprises a semiconductor film.

12. The laser irradiation apparatus according to claim 9 further comprising a stage for irradiating the laser light to the processing object,
   wherein a scanning speed of the stage is in the range of several tens to several thousand mm/s.

13. The laser irradiation apparatus according to claim 9 further comprising a stage for irradiating the laser light to the processing object,
   wherein a scanning speed of the stage is 100 to 2000 mm/s.

14. A laser irradiation apparatus comprising:
   a pulsed laser oscillator configured to supply a pulse laser;
   a non-linear optical element configured to convert a wavelength of the laser light; and
   an optical system configured to introduce the laser light whose wavelength is converted to a processing object, and to condense the laser light whose wavelength is converted on a processing object,
   wherein the pulsed laser introduced to the processing object has a pulse repetition rate 10 MHz or more, and
   wherein an inequality of ct<4nd is satisfied where c is a speed of light in vacuum, n is a refractive index of a substrate with the processing object formed thereover, d is a thickness of the substrate, and t is a pulse width of the laser light.

15. The laser irradiation apparatus according to claim 14, wherein the laser light whose wavelength is converted has a second harmonic.

16. The laser irradiation apparatus according to claim 14, wherein the processing object comprises a semiconductor film.

17. The laser irradiation apparatus according to claim 14 further comprising a stage for irradiating the laser light to the processing object,
   wherein a scanning speed of the stage is in the range of several tens to several thousand mm/s.

18. The laser irradiation apparatus according to claim 14 further comprising a stage for irradiating the laser light to the processing object,
   wherein a scanning speed of the stage is 100 to 2000 mm/s.

19. A laser irradiation apparatus comprising:
   a pulsed laser oscillator configured to supply a pulse laser;
   a non-linear optical element configured to convert a wavelength of the laser light; and
   an optical system configured to introduce the laser light whose wavelength is converted to a processing object, and to condense the laser light whose wavelength is converted on a processing object,
   wherein the pulsed laser oscillator has a pulse repetition rate from 10 MHz to 100 GHz; and
   wherein an inequality of ct<2nd is satisfied where c is a speed of light in vacuum, n is a refractive index of a substrate with the processing object formed thereover, d is a thickness of the substrate, and t is a pulse width of the laser light.

20. The laser irradiation apparatus according to claim 19, wherein the laser light whose wavelength is converted has a second harmonic.

21. The laser irradiation apparatus according to claim 19, wherein the processing object comprises a semiconductor film.

22. The laser irradiation apparatus according to claim 19 further comprising a stage for irradiating the laser light to the processing object,
   wherein a scanning speed of the stage is in the range of several tens to several thousand mm/s.

23. The laser irradiation apparatus according to claim 19 further comprising a stage for irradiating the laser light to the processing object,
   wherein a scanning speed of the stage is 100 to 2000 mm/s.

24. A laser irradiation apparatus comprising:
   a pulsed laser oscillator configured to supply a pulse laser;
   a non-linear optical element configured to convert a wavelength of the laser light; and
   an optical system configured to introduce the laser light whose wavelength is converted to a processing object, and to condense the laser light whose wavelength is converted on a processing object,
   wherein the pulsed laser oscillator has a pulse repetition rate from 10 MHz to 100 GHz; and
   wherein an inequality of ct<4nd is satisfied where c is a speed of light in vacuum, n is a refractive index of a substrate with the processing object formed thereover, d is a thickness of the substrate, and t is a pulse width of the laser light.

25. The laser irradiation apparatus according to claim 24, wherein the laser light whose wavelength is converted has a second harmonic.

26. The laser irradiation apparatus according to claim 24, wherein the processing object comprises a semiconductor film.

27. The laser irradiation apparatus according to claim 24 further comprising a stage for irradiating the laser light to the processing object,
   wherein a scanning speed of the stage is in the range of several tens to several thousand mm/s.

28. The laser irradiation apparatus according to claim 24 further comprising a stage for irradiating the laser light to the processing object,
   wherein a scanning speed of the stage is 100 to 2000 mm/s.

29. A laser irradiation method comprising the step of irradiating a processing object with pulsed laser light at a pulse repetition rate of 10 MHz or more,
   wherein an inequality of ct<2nd is satisfied where c is a speed of light in vacuum, n is a refractive index of a substrate with the processing object formed thereover, d is a thickness of the substrate, and t is a pulse width of the laser light.

30. The laser irradiation method according to claim 29, wherein the processing object comprises a semiconductor film.

31. The laser irradiation method according to claim 29 further comprising the step of irradiating the processing object mounted on a stage,
   wherein a scanning speed of the stage is in the range of several tens to several thousand mm/s.

32. The laser irradiation method according to claim 29 further comprising the step of irradiating the processing object mounted on a stage,
   wherein a scanning speed of the stage is 100 to 2000 mm/s.

33. A laser irradiation method comprising the step of irradiating a processing object with pulsed laser light at a pulse repetition rate from 10 MHz to 100 GHz,
   wherein an inequality of ct<4nd is satisfied where c is a speed of light in vacuum, n is a refractive index of a substrate with the processing object formed thereover, d is a thickness of the substrate, and t is a pulse width of the laser light.

34. The laser irradiation method according to claim 33, wherein the processing object comprises a semiconductor film.

35. The laser irradiation method according to claim 33 further comprising the step of irradiating the processing object mounted on a stage,
wherein a scanning speed of the stage is in the range of several tens to several thousand mm/s.

36. The laser irradiation method according to claim 33 further comprising the step of irradiating the processing object mounted on a stage,
wherein a scanning speed of the stage is 100 to 2000 mm/s.

37. A laser irradiation method comprising the steps of:
converting a wavelength of laser light emitted from a pulsed laser oscillator using a non-linear optical element; and
irradiating a processing object with the laser light whose wavelength is converted,
wherein a pulse repetition rate of the laser light irradiated to the processing object is 10 MHz or more,
wherein an inequality of ct<2nd is satisfied where c is a speed of light in vacuum, n is a refractive index of a substrate with the processing object formed thereover, d is a thickness of the substrate, and t is a pulse width of the laser light.

38. The laser irradiation method according to claim 37, wherein the laser light whose wavelength is converted has a second harmonic.

39. The laser irradiation method according to claim 37 further comprising the step of irradiating the processing object mounted on a stage,
wherein a scanning speed of the stage is in the range of several tens to several thousand mm/s.

40. The laser irradiation method according to claim 37 further comprising the step of irradiating the processing object mounted on a stage,
wherein a scanning speed of the stage is 100 to 2000 mm/s.

41. A laser irradiation method comprising the steps of:
converting a wavelength of laser light emitted from a pulsed laser oscillator using a non-linear optical element; and
irradiating a processing object with the laser light whose wavelength is converted,
wherein a pulse repetition rate of the laser light irradiated to the processing object is 10 MHz or more,
wherein an inequality of ct<4nd is satisfied where c is a speed of light in vacuum, n is a refractive index of a substrate with the processing object formed thereover, d is a thickness of the substrate, and t is a pulse width of the laser light.

42. The laser irradiation method according to claim 41, wherein the laser light whose wavelength is converted has a second harmonic.

43. The laser irradiation method according to claim 37, wherein the processing object comprises a semiconductor film.

44. The laser irradiation method according to claim 41, wherein the processing object comprises a semiconductor film.

45. The laser irradiation method according to claim 41 further comprising the step of irradiating the processing object mounted on a stage,
wherein a scanning speed of the stage is in the range of several tens to several thousand mm/s.

46. The laser irradiation method according to claim 41 further comprising the step of irradiating the processing object mounted on a stage,
wherein a scanning speed of the stage is 100 to 2000 mm/s.

47. A laser irradiation method comprising the steps of:
converting a wavelength of laser light emitted from a pulsed laser oscillator using a non-linear optical element; and
irradiating a processing object with the laser light whose wavelength is converted,
wherein a pulse repetition rate is from 10 MHz to 100 GHz; and
wherein an inequality of ct<2nd is satisfied where c is a speed of light in vacuum, n is a refractive index of a substrate with the processing object formed thereover, d is a thickness of the substrate, and t is a pulse width of the laser light.

48. The laser irradiation method according to claim 47, wherein the laser light whose wavelength is converted has a second harmonic.

49. The laser irradiation method according to claim 47, wherein the processing object comprises a semiconductor film.

50. The laser irradiation method according to claim 47 further comprising the step of irradiating the processing object mounted on a stage,
wherein a scanning speed of the stage is in the range of several tens to several thousand mm/s.

51. The laser irradiation method according to claim 47 further comprising the step of irradiating the processing object mounted on a stage,
wherein a scanning speed of the stage is 100 to 2000 mm/s.

52. A laser irradiation method comprising the steps of:
converting a wavelength of laser light emitted from a pulsed laser oscillator using a non-linear optical element; and
irradiating a processing object with the laser light whose wavelength is converted,
wherein a pulse repetition rate is from 10 MHz to 100 GHz; and
wherein an inequality of ct<4nd is satisfied where c is a speed of light in vacuum, n is a refractive index of a substrate with the processing object formed thereover, d is a thickness of the substrate, and t is a pulse width of the laser light.

53. The laser irradiation method according to claim 52, wherein the laser light whose wavelength is converted has a second harmonic.

54. The laser irradiation method according to claim 52, wherein the processing object comprises a semiconductor film.

55. The laser irradiation method according to claim 52 further comprising the step of irradiating the processing object mounted on a stage,
wherein a scanning speed of the stage is in the range of several tens to several thousand mm/s.

56. The laser irradiation method according to claim 52 further comprising the step of irradiating the processing object mounted on a stage,
wherein a scanning speed of the stage is 100 to 2000 mm/s.

57. A method for manufacturing a semiconductor device comprising the step of irradiating a processing object with pulsed laser light at a pulse repetition rate of 10 MHz or more,
wherein an inequality of ct<2nd is satisfied where c is a speed of light in vacuum, n is a refractive index of a substrate with the processing object formed thereover, d is a thickness of the substrate, and t is a pulse width of the laser light.

58. The method for manufacturing a semiconductor device according to claim 57, wherein the processing object comprises a semiconductor film.

59. The method for manufacturing a semiconductor device according to claim 57 further comprising the step of irradiating the processing object mounted on a stage,
wherein a scanning speed of the stage is in the range of several tens to several thousand mm/s.

60. The method for manufacturing a semiconductor device according to claim 57 further comprising the step of irradiating the processing object mounted on a stage,
wherein a scanning speed of the stage is 100 to 2000 mm/s.

61. A method for manufacturing a semiconductor device comprising the step of irradiating a processing object with pulsed laser light at a pulse repetition rate from 10 MHz to 100 GHz,
wherein an inequality of ct<4nd is satisfied where c is a speed of light in vacuum, n is a refractive index of a substrate with the processing object formed thereover, d is a thickness of the substrate, and t is a pulse width of the laser light.

62. The method for manufacturing a semiconductor device according to claim 61, wherein the processing object comprises a semiconductor film.

63. The method for manufacturing a semiconductor device according to claim 61 further comprising the step of irradiating the processing object mounted on a stage,
wherein a scanning speed of the stage is in the range of several tens to several thousand mm/s.

64. The method for manufacturing a semiconductor device according to claim 61 further comprising the step of irradiating the processing object mounted on a stage,
wherein a scanning speed of the stage is 100 to 2000 mm/s.

65. A method for manufacturing a semiconductor device comprising the steps of:
converting a wavelength of laser light emitted from a pulsed laser oscillator using a non-linear optical element; and
irradiating a processing object with laser light whose wavelength is converted,
wherein a pulse repetition rate of the laser light irradiated to the processing object is 10 MHz or more, and
wherein an inequality of ct<2nd is satisfied where c is a speed of light in vacuum, n is a refractive index of a substrate with the processing object formed thereover, d is a thickness of the substrate, and t is a pulse width of the laser light.

66. The method for manufacturing a semiconductor device according to claim 65, wherein the laser light whose wavelength is converted has a second harmonic.

67. The method for manufacturing a semiconductor device according to claim 65, wherein the processing object comprises a semiconductor film.

68. The method for manufacturing a semiconductor device according to claim 65 further comprising the step of irradiating the processing object mounted on a stage,
wherein a scanning speed of the stage is in the range of several tens to several thousand mm/s.

69. The method for manufacturing a semiconductor device according to claim 65 further comprising the step of irradiating the processing object mounted on a stage,
wherein a scanning speed of the stage is 100 to 2000 mm/s.

70. A method for manufacturing a semiconductor device comprising the steps of:
converting a wavelength of laser light emitted from a pulsed laser oscillator using a non-linear optical element; and
irradiating a processing object with laser light whose wavelength is converted,
wherein a pulse repetition rate of the laser light irradiated to the processing object is 10 MHz or more,
wherein an inequality of ct<4nd is satisfied where c is a speed of light in vacuum, n is a refractive index of a substrate with the processing object formed thereover, d is a thickness of the substrate, and t is a pulse width of the laser light.

71. The method for manufacturing a semiconductor device according to claim 70, wherein the laser light whose wavelength is converted has a second harmonic.

72. The method for manufacturing a semiconductor device according to claim 70, wherein the processing object comprises a semiconductor film.

73. The method for manufacturing a semiconductor device according to claim 70 further comprising the step of irradiating the processing object mounted on a stage,
wherein a scanning speed of the stage is in the range of several tens to several thousand mm/s.

74. The method for manufacturing a semiconductor device according to claim 70 further comprising the step of irradiating the processing object mounted on a stage,
wherein a scanning speed of the stage is 100 to 2000 mm/s.

75. A method for manufacturing a semiconductor device comprising the steps of:
converting a wavelength of laser light emitted from a pulsed laser oscillator using a non-linear optical element; and
irradiating a processing object with laser light whose wavelength is converted,
wherein a pulse repetition rate is from 10 MHz to 100 GHz; and
wherein an inequality of ct<2nd is satisfied where c is a speed of light in vacuum, n is a refractive index of a substrate with the processing object formed thereover, d is a thickness of the substrate, and t is a pulse width of the laser light.

76. The method for manufacturing a semiconductor device according to claim 75, wherein the laser light whose wavelength is converted has a second harmonic.

77. The method for manufacturing a semiconductor device according to claim 75, wherein the processing object comprises a semiconductor film.

78. The method for manufacturing a semiconductor device according to claim 75 further comprising the step of irradiating the processing object mounted on a stage,
wherein a scanning speed of the stage is in the range of several tens to several thousand mm/s.

79. The method for manufacturing a semiconductor device according to claim 75 further comprising the step of irradiating the processing object mounted on a stage,
wherein a scanning speed of the stage is 100 to 2000 mm/s.

80. A method for manufacturing a semiconductor device comprising the steps of:
converting a wavelength of laser light emitted from a pulsed laser oscillator using a non-linear optical element; and irradiating a processing object with laser light whose wavelength is converted, wherein a pulse repetition rate is from 10 MHz to 100 GHz; and wherein an inequality of ct<4nd is satisfied where c is a speed of light in vacuum, n is a refractive index of a substrate with the processing object formed thereover, d is a thickness of the substrate, and t is a pulse width of the laser light.

81. The method for manufacturing a semiconductor device according to claim 80, wherein the laser light whose wavelength is converted has a second harmonic.

82. The method for manufacturing a semiconductor device according to claim 80, wherein the processing object comprises a semiconductor film.

83. The method for manufacturing a semiconductor device according to claim 80 further comprising the step of irradiating the processing object mounted on a stage, wherein a scanning speed of the stage is in the range of several tens to several thousand mm/s.

84. The method for manufacturing a semiconductor device according to claim 80 further comprising the step of irradiating the processing object mounted on a stage, wherein a scanning speed of the stage is 100 to 2000 mm/s.

* * * * *